United States Patent
Okano

[11] Patent Number: 6,148,675
[45] Date of Patent: Nov. 21, 2000

[54] METHOD OF MEASURING STRAIN

[75] Inventor: Haruki Okano, Kiryu, Japan

[73] Assignee: Tokyo Sokki Kenkyujo Co., Ltd., Tokyo, Japan

[21] Appl. No.: 09/209,745

[22] Filed: Dec. 11, 1998

[30] Foreign Application Priority Data

Dec. 11, 1997 [JP] Japan .................................... 9-341715

[51] Int. Cl.[7] ...................................................... G01B 7/16
[52] U.S. Cl. ............................................... 73/763; 73/789
[58] Field of Search ............................. 73/789, 791, 794, 73/763, 767

[56] References Cited

U.S. PATENT DOCUMENTS

| | | | |
|---|---|---|---|
| 3,650,340 | 3/1972 | Bradley .................................. | 177/136 |
| 4,416,163 | 11/1983 | Yorgiadis ............................ | 73/862.622 |
| 4,637,263 | 1/1987 | Fritz et al. ......................... | 73/862.045 |
| 4,869,113 | 9/1989 | Sarrazin ............................. | 73/862.622 |

OTHER PUBLICATIONS

Stephan Keil, "Beanspruchungsermittlung mit Dehungsmesstreifen," Doc. No. XP–002095998 (1995), pp. 160–166 and 205–210.

*Primary Examiner*—Max Noori
*Attorney, Agent, or Firm*—Paul A. Guss

[57] ABSTRACT

Strain of an object is measured by a bridge having, in one arm thereof, a strain gage for producing a resistance change depending on the strain developed in the object, and having resistors in the respective remaining three arms thereof. The resistors have respective resistances independent of the strain developed in the object. A pair of power corners are disposed at one pair of diagonally opposite joints, and a pair of signal corners are disposed at another pair of diagonally opposite joints of the strain gage. Strain is measured by detecting an output voltage between the signal corners of the bridge as an initial unbalanced output voltage $e_0$ while no strain is being detecting by the strain gage, applying a power supply voltage between the power corners of the bridge, and detecting an output voltage e between the signal corners to detect strain of the object. Strain developed in the object is measured based on a value $\epsilon_a$ determined using the detected output voltage e and the initial unbalanced output voltage $e_0$ according to a predetermined relationship between variables e and $e_0$, a voltage value V of the power supply voltage applied between the power corners of the bridge, a gage factor K of the strain gage, and resistances $R_3$ and $R_4$ of the resistors in arms of the bridge which are positioned opposite to the arm holding the strain gage and adjacent to the arm holding the strain gage, respectively.

12 Claims, 11 Drawing Sheets

PRIOR ART

PRIOR ART

PRIOR ART

METHOD OF MEASURING STRAIN

BACKGROUND OF THE INVENTION

1. Field of the Invention

The present invention relates to a method of measuring strain with a strain gage.

2. Description of the Related Art

Generally, it has been known to measure a deformation of an object with a bridge, specifically, a Wheat-stone bridge, comprising a strain gage, as an arm, applied to the object for producing a resistance change depending on the strain and a plurality of resistors as other three arms.

Since strain of an object is proportional to stress to which the object is subjected, the term "strain" used herein will cover stress as well as strain in its original sense, and strain in its original sense will be denoted by the reference character "$\epsilon$" with or without any subscripts.

Methods of measuring strain with a bridge which has a strain gage, as one arm, applied to an object whose strain is to be measured are classified into one-gage methods and two-gage common-dummy methods. The one-gage methods include a one-gage two-wire method and a one-gage three-wire method.

FIG. 1 of the accompanying drawings shows a circuit illustrative of the one-gage two-wire method which is the most basic method of measuring strain with a bridge. According to the one-gage two-wire method, as shown in FIG. 1, two leads 2, 3 are connected to respective opposite terminals of a strain gage 1 applied to an object whose strain is to be measured. The method is called a two-wire method because of the two leads 2, 3 connected to the strain gage 1. The strain gage 1 is connected by the leads 2, 3 to a resistive circuit composed of resistors 4, 5, 6. The strain gage 1 and the resistors 4, 5, 6 jointly make up a bridge 7 which has the strain gage 1 (specifically, the strain gage 1 and the leads 2, 3) as one arm and the resistors 4, 5, 6 as other three arms.

The resistors 4, 5, 6 basically comprise resistive elements whose respective resistances $R_2$, $R_3$, $R_4$ are constant irrespective of strain developed in the object, e.g., resistive elements having respective fixed resistances. Usually, the resistances $R_2$, $R_3$, $R_4$ of the resistors 4, 5, 6 are represented by $R_0 = R_2 = R_3 = R_4$ where $R_0$ is the reference resistance of the strain gage 1 when no strain is developed by the strain gage 1, i.e., the nominal resistance of the strain gage 1.

For measuring strain of the object with the bridge 7, a power supply voltage V (constant voltage) from a power supply for the bridge 7 is applied between power corners $I_1$, $I_2$ (at diagonally opposite junctions of the bridge 7). The power corner $I_1$ is located at the junction between the lead 2 and the resistor 6 or a point at the same potential as the junction between the lead 2 and the resistor 6, and the power corner $I_2$ is located at the junction between the resistor 4 and the resistor 5 or a point at the same potential as the junction between the resistor 4 and the resistor 5. With the power supply voltage V being applied between the power corners $I_1$, $I_2$, an output voltage e of the bridge 7 is detected between signal corners $O_1$, $O_2$ (at other diagonally opposite junctions of the bridge 7). The signal corner $O_1$ is located at the junction between the lead 3 and the resistor 4 or a point at the same potential as the junction between the lead 3 and the resistor 4, and the signal corner $O_2$ is located at the junction between the resistor 5 and the resistor 6 or a point at the same potential as the junction between the resistor 5 and the resistor 6.

If it is assumed that the leads 2, 3 have negligibly small resistances $r_{a1}$, $r_{a2}$ ($r_{a1} \approx 0$, $r_{a2} \approx 0$), and $R_0 = R_2 = R_3 = R_4$ as described above, then strain $\epsilon$ (in its original sense) developed in the object to which the strain gage 1 is applied and the output voltage e of the bridge 7 are related to each other according to the following equation (8):

$$\varepsilon = \frac{4}{K} \cdot \frac{e}{V - 2e} \tag{8}$$

where K represents the gage factor of the strain gage 1.

Therefore, by detecting the output voltage e of the bridge 7, the strain e of the object can be calculated from the detected output voltage e according to the equation (8).

For strain measurement, it is the general practice to set the power supply voltage V for the bridge 7 to V=2 (V) and to employ the strain gage 1 whose gage factor K is K=2. According to this general practice, the equation (8) is rewritten as follows:

$$\varepsilon = \frac{e}{1-e} \tag{9}$$

If the strain $\epsilon$ is sufficiently small (e<<1), then the denominator of the right-hand side of the equation (9) may be ignored, and the strain $\epsilon$ may be determined as $\epsilon = e$. Furthermore, since the strain $\epsilon$ of the object and the stress $\sigma$ under which the object is placed to cause the strain $\epsilon$ are related to each other according to $\sigma = E \cdot \epsilon$ (E represents the Young's modulus of the object), the stress to which the object is subjected can be determined from the output voltage e by multiplying the right-hand side of the equation (8) or (9) by the Young's modulus E of the object.

The above process is the basic process of measuring stress with a strain gage.

FIG. 2 of the accompanying drawings shows a circuit illustrative of the one-gage three-wire method. According to the one-gage three-wire method, as shown in FIG. 2, two leads 2, 3 are connected to respective opposite terminals of a strain gage 1 applied to an object whose strain is to be measured, and an auxiliary lead 8 is also connected to one of the terminals of the strain gage 1, i.e., the terminal thereof to which the lead 3 is connected. The method is called a three-wire method because of the three leads 2, 3, 8 connected to the strain gage 1.

As with the circuit for carrying out the one-gage two-wire method shown in FIG. 1, the strain gage 1 is connected by the leads 2, 3 to a resistive circuit composed of resistors 4, 5, 6, making up a bridge 9.

For measuring strain of the object with the bridge 9, a power supply voltage V (constant voltage) for the bridge 9 is applied between power corners $I_1$, $I_2$ (at diagonally opposite junctions of the bridge 9). The power corner $I_1$ is located at the junction between the lead 2 and the resistor 6 or a point at the same potential as the junction between the lead 2 and the resistor 6, and the power corner 12 is located at the junction between the resistor 4 and the resistor 5 or a point at the same potential as the junction between the resistor 4 and the resistor 5.

According to the one-gage three-wire method, other diagonally opposite junctions of the bridge 9 are the terminal of the bridge 9 to which the leads 3, 8 are connected and the junction between the resistor 5 and the resistor 6 or a point at the same potential as the junction between the resistor 5 and the resistor 6. With the power supply voltage V being applied between the power corners $I_1$, $I_2$, an output voltage e of the bridge 9 is detected between signal corners $O_1$, $O_2$ at these other diagonally opposite junctions of the bridge 7.

The auxiliary lead 8 is used to detect the output voltage e of the bridge 9. The arm of the bridge 9 which includes the strain gage 1 is made up of the strain gage 1 and the lead 2, and the arm of the bridge 9 which includes the resistor 4 is made up of the resistor 4 and the lead 3.

If it is also assumed, according to the one-gage three-wire method, that the leads 2, 3 have negligibly small resistances $r_{a1}$, $r_{a2}$ ($r_{a1} \approx 0$, $r_{a2} \approx 0$), and $R_0 = R_2 = R_3 = R_4$ as described above, then the above equation (8) is satisfied. If V=2 (V) and K=2, then the above equation (9) is satisfied. Therefore, strain $\epsilon$ developed in the object and stress to which the object is subjected can be calculated according to the equation (8) or (9). It is known that the one-gage three-wire method is more effective than the one-gage two-wire method to cancel the effect of a change in the resistances of the resistors 2, 3 due to a change in the ambient temperature on the strain measurement.

FIG. 3 of the accompanying drawings shows a circuit illustrative of a two-gage common-dummy method. According to the two-gage common-dummy method, as shown in FIG. 3, the circuit differs from the circuit according to the one-gage two-wire method shown in FIG. 2 in that the resistor 4 in the circuit shown in FIG. 2 is replaced with a strain gage 10 (called a dummy gage) as a resistor having the same characteristics as the strain gage 1. The strain gage 10 is incorporated in the arm with leads 11, 12 connected to respective terminals thereof. The strain gages 1, 10 and the resistors 5, 6 jointly make up a bridge 13.

The dummy gage 10 is positioned near the strain gage 1 applied to the object, i.e., in an area having the temperature environment as the strain gage 1 and free of strain. Since the dummy gage 10 has the same characteristics as the strain gage 1 and is positioned so as to be free of strain, the dummy gage 10 has a resistance $R_d$ which is basically equal to the reference resistance $R_0$ of the strain gage 1 ($R_d = R_0$) According to the two-gage common-dummy method, it is also assumed that the resistances $R_3$, $R_4$ of the resistors 5, 6 are represented by $R_0 = R_3 = R_4$.

For measuring strain of the object with the bridge 13, a power supply voltage V for the bridge 13 is applied between power corners $I_1$, $I_2$ (at diagonally opposite junctions of the bridge 13). The power corner $I_1$ is located at the junction between the lead 2 and the resistor 6 or a point at the same potential as the junction between the lead 2 and the resistor 6, and the power corner $I_2$ is located at the junction between the lead 12 and the resistor 5 or a point at the same potential as the junction between the lead 12 and the resistor 5. With the power supply voltage V being applied between the power corners $I_1$, $I_2$, an output voltage e of the bridge 13 is detected between signal corners $O_1$, $O_2$ (at other diagonally opposite junctions of the bridge 13). The signal corner $O_1$ is located the junction between the lead 3 and the lead 11 or a point at the same potential as the junction between the lead 3 and the lead 11, and the signal corner $O_2$ is located at the junction between the resistor 5 and the resistor 6 or a point at the same potential as the junction between the resistor 5 and the resistor 6.

If it is also assumed, according to the two-gage common-dummy method, that the leads 2, 3 and 11, 12 have negligibly small resistances $r_{a1}$, $r_{a2}$, $r_{d1}$, $r_{d2}$, and $R_0 = Rd = R_3 = R_4$ as described above, then the above equation (8) is satisfied as with the one-gage two-wire method. If V=2 (V) and K=2, then the above equation (9) is satisfied. Therefore, strain $\epsilon$ developed in the object and stress to which the object is subjected can be calculated according to the equation (8) or (9).

According to the two-gage common-dummy method, even when the resistance of the strain gage 1 varies due to a change in the ambient temperature, the resistance of the dummy gage 10 also varies in the same manner as the resistance of the strain gage 1, and even when the resistances of the leads 2, 3 of the strain gage 1 vary due to a change in the ambient temperature, the leads 11, 12 of the dummy gage 10 vary in the same manner as the resistances of the leads 2, 3. Therefore, the two-gage common-dummy method is used as effective to cancel the effect of a change in the resistances of the strain gage 1 and the resistors 2, 3, 11, 12 due to a change in the ambient temperature on the strain measurement.

The strain measuring device for measuring strain according to the one-gage methods has a resistive circuit composed of the strain gage 1 and the resistors 4, 5, 6 of the bridges 7, 9, which are interconnected by circuit patterns on a circuit board. The strain measuring device for measuring strain according to the two-gage common-dummy method has a resistive circuit composed of the strain gages 1, 10 and the resistors 5, 6 of the bridge 13, which are also interconnected by circuit patterns on a circuit board. The strain gage 1 and the dummy gage 10 are connected to the resistive circuits by the leads, making up the bridges 7, 9, 13.

For measuring strain at a plurality of locations on an object or for measuring strain on a plurality of objects with a multispot strain measuring device, strain gages 1 (or strain gages 1 and dummy gages 10 according to the two-gage common dummy method) disposed at respective measuring spots are connected to a switch box which houses the resistive circuit. In operation, the strain gages 1 connected to the resistive circuit are successively switched by a switch in the switch box to establish the bridges 7, 9, 13 at each of the measuring spots.

In the strain measuring devices with the bridges 7, 9, 13, the power supply voltage V from the power supply is applied to the bridges 7, 9, 13, and the output voltage e of the bridges 7, 9, 13 is detected through an amplifier, an A/D converter, etc. From the data of the detected output voltage e, data indicative of strain is generated according to the equation (8) or (9). The generated strain data is then displayed on a display unit. The data of the detected output voltage e may be transmitted on-line to a personal computer or transmitted to a personal computer by a floppy disk or another recording medium. The personal computer may then generate strain data from the received data, and analyze the received data.

According to the above conventional strain measuring methods, strain is measured from the output voltage e of the bridges 7, 9, 13 according to the equation (8). Therefore, the premise of the strain measuring methods is that the output voltage e of the bridges 7, 9, 13 is e=0 when the strain gage 1 applied to the object does not develop strain, i.e., $\epsilon=0$. Stated otherwise, the premise of the strain measuring methods is that the bridges 7, 9, 13 are in a state of balance when there is no resistance change depending on strain of the strain gage 1.

According to the above various strain measuring methods or the strain measuring devices based thereon, therefore, the strain gage 1, the resistors 4, 5, 6, and the dummy gage 10 are selected to have highly accurate resistances to meet the relationship $R_0 = R_2 = R_3 = R_4$ (the one-gage methods) or the relationship $R_0 = R_d = R_3 = R_4$ (the two-gage common-dummy method) for thereby equalizing the resistances of the arms of the bridges 7, 9, 13 as much as possible.

Actually, however, it is difficult to eliminate or sufficiently reduce the output voltage e of the bridges 7, 9, 13 when no strain is developed on the strain gage 1 applied to the object, because of the resistances of leads by which the strain gage 1, the resistors 4, 5, 6, and the strain gage 10 are interconnected.

Particularly, when strain is measured at a plurality of spots on a large object such as a structure or the like with the multispot strain measuring device, the leads 2, 3 or 11, 12 connecting the strain gage 1 and the dummy gage 10 to the bridges 7, 9, 13 are necessarily long and have relatively large resistances. In addition, those leads 2, 3 or 11, 12 have different lengths and hence have different resistances. As a result, in such a multispot strain measuring application, the output voltage e of the bridges 7, 9, 13 at the time no strain is developed on the strain gage 1 applied to the object may be neither eliminated nor sufficiently reduced, but may be often relatively large.

According to the above strain measuring methods, therefore, the bridges 7, 9, 13 generally produce a certain output voltage e ($e \neq 0$) when no strain is developed on the strain gage 1. The output voltage e thus generated by the bridges 7, 9, 13 at the time no strain is developed on the strain gage 1 is referred to as an "initial unbalanced output voltage $e_0$") Any strain $\epsilon$ calculated according to the equation (8) from the output voltage e generated by the bridges 7, 9, 13 which generate such initial unbalanced output voltage $e_0$ is not accurate because even when no strain is developed on the strain gage 1, a strain $\epsilon$ expressed by $\epsilon = (4/K) \cdot [e_0(V-2 \cdot e_0)]$ is calculated according to the equation (8) from the output voltage e generated by the bridges 7, 9, 13 which generate the initial unbalanced output voltage $e_0$.

It has been customary to cancel the effect of the initial unbalanced output voltage $e_0$ generated by the bridges 7, 9, 13 on the strain measurement as follows:

The initial unbalanced output voltage $e_0$ generated by the bridges 7, 9, 13 is measured in advance, and an apparent strain $\epsilon_0 (=(4/K) \cdot [e_0/(V-2 \cdot e_0)])$ of the strain gage 1 which corresponds to the initial unbalanced output voltage $e_0$ is calculated from the initial unbalanced output voltage $e_0$ according to the equation (8) Then, the apparent strain $\epsilon_0$ is subtracted from the strain $\epsilon$ which is calculated according to the equation (8) from the output voltage e generated by the bridges 7, 9, 13 upon strain measurement, thereby determining a strain $\epsilon_p$. Stated otherwise, a strain $\epsilon_p$ is calculated from the initial unbalanced output voltage $e_0$ and the output voltage e generated by the bridges 7, 9, 13 upon strain measurement according to the following equation (10):

$$\varepsilon = \frac{4}{K} \cdot \frac{e}{V-2e} - \frac{4}{K} \cdot \frac{e_0}{V-2e_0} \quad (10)$$

$$= \frac{4V}{K} \cdot \frac{e-e_0}{(V-2e) \cdot (V-2e_0)}$$

Since V=2 (V) and K=2, the equation (10) is rewritten as the following equation (11):

$$\varepsilon = \frac{e}{1-e} - \frac{e_0}{1-e_0} \quad (11)$$

$$= \frac{e-e_0}{(1-e) \cdot (1-e_0)}$$

However, a study conducted by the inventors of the present invention has revealed that the above process of canceling the effect of the initial unbalanced output voltage $e_0$ on the strain measurement fails to measure strain $\epsilon$ (or stress depending thereon) accurately.

Specifically, as can be seen from the equation (8), the correlation between the output voltage e of the bridges 7, 9, 13 and the strain $\epsilon$ at the time the initial unbalanced output voltage $e_0$ is $e_0=0$ is nonlinear (it may be regarded as linear insofar as the strain $\epsilon$ is sufficiently small), and is represented by a solid-line curve a in FIG. 4 of the accompanying drawings. The actual correlation between the output voltage e of the bridges 7, 9, 13 which is caused by the initial unbalanced output voltage $e_0$ ($e_0 \neq 0$) and the strain 6 is represented by a solid-line curve b in FIG. 4. The curve b is slightly different in shape from the curve a.

According to the above process of canceling the effect of the initial unbalanced output voltage $e_0$ on the strain measurement, as can be understood from the equation (10), the difference $\epsilon_p$ between the apparent strain $\epsilon_0$ corresponding to the initial unbalanced output voltage $e_0$ and a strain $\epsilon_{xp}$ corresponding to the output voltage e (indicated by $e_x$ in FIG. 4) obtained upon strain measurement $\epsilon_p$ ($=\epsilon_{xp}-\epsilon_0$) according to the solid-line curve a is determined as strain $\epsilon$ ($=\epsilon_p$) free of the effect of the initial unbalanced output voltage $e_0$.

However, the actual correlation between the output voltage e at the time initial unbalanced output voltage $e_0$ is $e_0 \neq 0$ and the strain $\epsilon$ is represented by the solid-line curve b. Therefore, the actual strain $\epsilon$ corresponding to the output voltage $e_x$ upon strain measurement has a value $\epsilon_x$ in FIG. 4. Since the correlation between the output voltage e and the strain $\epsilon$ is nonlinear, the strain $\epsilon_p = \epsilon_{xp} - \epsilon_0$ determined according to the conventional process and the actual strain $\epsilon = \epsilon_x$ do not agree with each other, as can clearly be seen from FIG. 4.

Therefore, the conventional process of measuring strain while canceling the effect of the initial unbalanced output voltage $e_0$ according to the equation (10) cannot make highly accurate strain measurement.

According to the above various strain measuring methods or the strain measuring devices based thereon, as described above, strain is basically measured according to the equation (8), and the strain gage 1, the resistors 4, 5, 6, and the dummy gage 10 are selected to have highly accurate resistances to equalize the resistances of the arms of the bridges 7, 9, 13 as much as possible. Therefore, the strain gage 1, the resistors 4, 5, 6, and the dummy gage 10 are highly expensive, and need to be fabricated according to highly advanced fabrication technology.

The strain measuring devices based on the strain measuring methods are required to take necessary measures to cancel the resistance of the circuit pattern of the resistive circuit composed of the bridges 7, 9, 13 with the strain gage 1 connected thereto, and also to employ a switch having small contact resistances for switching strain gages 1 connected to the resistive circuit for multi-spot strain measurement. As a result, the strain measuring devices are relatively expensive to manufacture.

SUMMARY OF THE INVENTION

It is therefore an object of the present invention to provide a method of measuring strain of an object accurately from the output voltage of a bridge which has a strain gage as an arm to be applied to the object, while appropriately canceling the effect of an initial unbalanced output voltage of the bridge, so that an inexpensive and simple strain measuring system can be constructed using the method.

Another object of the present invention is to provide a method of measuring strain of an object with increased accuracy based on the output voltage of a bridge which has a strain gage as an arm to be applied to the object, while canceling the effect of resistances of leads connected to the strain gage.

In view of the drawbacks of the conventional strain measuring methods, the inventors of the present invention have studied the output voltage e of the bridge circuits 7, 9,

13 (see FIGS. 1 through 3) with respect to the one-gage two-wire method, the one-gage three-wire method, and the two-gage common-dummy method, and have made the following findings:

For a generalized explanation, as shown in FIG. 5 of the accompanying drawings, a bridge B having four strain gages $G_1$–$G_4$ as respective arms will be considered below. The bridge B is a so-called four-active-arm bridge.

It is assumed that the strain gages $G_1$–$G_4$ have respective reference resistances (nominal resistances) $R_{10}$–$R_{40}$ which are resistances when no strain is developed on the strain gages $G_1$–$G_4$, and the resistances of the strain gages $G_1$–$G_4$ vary by $\Delta R_1$–$\Delta R_4$, respectively, depending on strain of the strain gages $G_1$–$G_4$, i.e., the strain gages $G_1$–$G_4$ have respective resistances $R_{10}+\Delta R_1$–$R_{40}+\Delta R_4$ when strain is developed thereon, that the strain gages $G_n$ (n=1, 2, 3, 4) are incorporated in the bridge B by leads $L_{n1}$, $L_{n2}$ (n=1, 2, 3, 4) connected to opposite terminals of the strain gages $G_n$ and having respective resistances $r_{n1}$, $r_{n2}$ (n=1, 2, 3, 4), and that the sum $(r_{n1}+r_{n2})$ of the resistances $r_{n1}$, $r_{n2}$ (n=1, 2, 3, 4) of the leads $L_{n1}$, $L_{n2}$ (n=1, 2, 3, 4) connected to the opposite terminals of the strain gages $G_n$ is represented by $r_n$ (n=1, 2, 3, 4).

It is also assumed that the junction between the lead $L_{11}$ of the strain gage $G_1$ and the lead $L_{42}$ of the strain gage $G_4$ or a point at the same potential as the junction between the lead $L_{11}$ and the lead $L_{42}$, and the junction between the lead $L_{22}$ of the strain gage $G_2$ and the lead $L_{31}$ of the strain gage $G_3$ or a point at the same potential as the junction between the lead $L_{22}$ and the lead $L_{31}$ are regarded as respective power corners $I_1$, $I_2$ of the bridge B, and that the junction between the lead $L_{12}$ of the strain gage $G_1$ and the lead $L_{21}$ of the strain gage $G_2$ or a point at the same potential as the junction between the lead $L_{12}$ and the lead $L_{21}$, and the junction between the lead $L_{32}$ of the strain gage $G_3$ and the lead $L_{41}$ of the strain gage $G_4$ or a point at the same potential as the junction between the lead $L_{32}$ and the lead $L_{41}$ are regarded as respective signal corners $O_1$, $O_2$ of the bridge B.

It is further assumed that the resistances of the strain gages $G_n$ vary primarily due to strain thereof, and the resistances of the leads $L_{n1}$, $L_{n2}$ (n=1, 2, 3, 4) do not vary with time, i.e., remain constant over time, or any time-dependent change thereof is negligibly small.

When a power supply voltage V is applied between the power corners $I_1$, $I_2$, an output voltage e produced between the signal corners $O_1$, $O_2$ is given according to the following equation (12):

$$e = \left( \frac{R_{10} + \Delta R_1 + r_1}{R_{10} + \Delta R_1 + R_{20} + \Delta R_2 + r_1 + r_2} - \frac{R_{40} + \Delta R_4 + r_4}{R_{30} + \Delta R_3 + R_{40} + \Delta R_4 + r_3 + r_4} \right) \cdot V \quad (12)$$

From the equation (12), the initial unbalanced output voltage $e_0$ of the bridge B when no strain is developed on the strain gages $G_n$ (n=1, 2, 3, 4), i.e., when $\Delta R_{n=0}$ (n=1, 2, 3, 4), is expressed by the following equation (13):

$$e_0 = \left( \frac{R_{10} + r_1}{R_{10} + R_{20} + r_1 + r_2} - \frac{R_{40} + r_4}{R_{30} + R_{40} + r_3 + r_4} \right) \cdot V \quad (13)$$

From the equation (13), the following equation (14) is obtained:

$[(R_{10}+r_1) \cdot (R_{30}+r_3) - (R_{40}+r_4) \cdot (R_{20}+r_2)] \cdot V = (R_{10}+R_{20}+r_1+r_2) \cdot (R_{30}+$ $R_{40}+r_3+r_4) \cdot e_0$ \quad (14)

The equation (12) is modified into the following equation (15):

$$\Delta R_1 \cdot [(R_{30} + \Delta R_3 + r_3) \cdot V - (R_{30} + \Delta R_3 + R_{40} + \Delta R_4 + r_3 + r_4) \cdot e] - \quad (15)$$
$$\Delta R_2 \cdot [(R_{40} + \Delta R_4 + r_4) \cdot V + (R_{30} + \Delta R_3 + R_{40} + \Delta R_4 + r_3 + r_4) \cdot e] +$$
$$\Delta R_3 \cdot [(R_{10} + r_1) \cdot V + (R_{10} + R_{20} + r_1 + r_2) \cdot e] -$$
$$\Delta R_4 \cdot [(R_{20} + r_2) \cdot V - (R_{10} + R_{20} + r_1 + r_2) \cdot e] =$$
$$(R_{10} + R_{20} + r_1 + r_2) \cdot (R_{30} + R_{40} + r_3 + r_4) \cdot e -$$
$$[(R_{10} + r_1) \cdot (R_{30} + r_3) - (R_{40} + r_4) \cdot (R_{20} + r_2)] \cdot V$$

The second term of the right-hand side of the equation (15) is replaced with the right-hand side of the equation (14), and both sides of the equation (15) are modified into the following equation (16):

$$\Delta R_1 \cdot [(R_{30} + r_3) \cdot V - \quad (16)$$
$$(R_{30} + R_{40} + r_3 + r_4) \cdot e + \Delta R_3 \cdot V - (\Delta R_3 + \Delta R_4) \cdot e] -$$
$$\Delta R_2 \cdot [(R_{40} + r_4) \cdot V + (R_{30} + R_{40} + r_3 + r_4) \cdot e +$$
$$\Delta R_4 \cdot V + (\Delta R_3 + \Delta R_4) \cdot e] +$$
$$\Delta R_3 \cdot [(R_{10} + r_1) \cdot V + (R_{10} + R_{20} + r_1 + r_2) \cdot e] -$$
$$\Delta R_4 \cdot [(R_{20} + r_2) \cdot V + (R_{10} + R_{20} + r_1 + r_2) \cdot e] =$$
$$(R_{10} + R_{20} + r_1 + r_2) \cdot (R_{30} + R_{40} + r_3 + r_4) \cdot (e - e_0)$$

The strains of the strain gages $G_n$ (n=1, 2, 3, 4), which are basically equal to the strains of an object if the strain gages $G_n$ are applied to the object, are represented by $\varepsilon_n$ (n =1, 2, 3, 4), and the gage factors of the strain gages $G_n$ by $K_n$ (n=1, 2, 3, 4). The strains $\varepsilon_n$ (in the original sense) and changes $\Delta R_n$ in the resistances of the strain gages $G_n$ are related to each other according to the following equation (17):

$$\varepsilon_n = \frac{1}{K_n} \cdot \frac{\Delta R_n}{R_{n0}} (n = 1, 2, 3, 4) \quad (17)$$
$$\therefore \Delta R_n = K_n \cdot \varepsilon_n \cdot R_{n0}$$

Therefore, the equation (16) is rewritten into the following equation (18):

$$K_1 \cdot \varepsilon_1 \cdot R_{10} \cdot [(R_{30} + r_3) \cdot V - (R_{30} + R_{40} + r_3 + r_4) \cdot e + \quad (18)$$
$$K_3 \cdot \varepsilon_3 \cdot R_{30} \cdot V - (K_3 \cdot \varepsilon_3 \cdot R_{30} + K_4 \cdot \varepsilon_4 \cdot R_{40}) \cdot e] -$$
$$K_2 \cdot \varepsilon_2 \cdot R_{20} \cdot [(R_{40} + r_4) \cdot V + (R_{30} + R_{40} + r_3 + r_4) \cdot e$$
$$K_4 \cdot \varepsilon_4 \cdot R_{40} \cdot V + (K_3 \cdot \varepsilon_3 \cdot R_{30} + K_4 \cdot \varepsilon_4 \cdot R_{40}) \cdot e] +$$
$$K_3 \cdot \varepsilon_3 \cdot R_{30} \cdot [(R_{10} + r_1) \cdot V - (R_{10} + R_{20} + r_1 + r_2) \cdot e] -$$
$$K_4 \cdot \varepsilon_4 \cdot R_{40} \cdot [(R_{20} + r_2) \cdot V + (R_{10} + R_{20} + r_1 + r_2) \cdot e] =$$
$$(R_{10} + R_{20} + r_1 + r_2) \cdot (R_{30} + R_{40} + r_3 + r_4) \cdot (e - e_0)$$

When the equation (14) is solved for $(R_{20}+r_2)$, the following equation (19) is obtained:

$$R_{20} + r_2 = \frac{(R_{10} + r_1) \cdot [(R_{30} + r_3) \cdot V - (R_{30} + R_{40} + r_3 + r_4) \cdot e_0]}{(R_{40} + r_4) \cdot V + (R_{30} + R_{40} + r_3 + r_4) \cdot e_0} \quad (19)$$

From the equation (19), ($R_{10}+R_{20}+r_1+r_2$) contained in the right-hand side of the equation (18) is given by the following equation (20):

$$R_{10} + R_{20} + r_1 + r_2 = \frac{(R_{10} + r_1) \cdot (R_{30} + R_{40} + r_3 + r_4) \cdot V}{(R_{40} + r_4) \cdot V + (R_{30} + R_{40} + r_3 + r_4) \cdot e_0} \quad (20)$$

When the equation (20) is applied to the equation (18), the equation (18) is rewritten into the following equation (21):

$$K_1 \cdot \varepsilon_1 \cdot R_{10} \cdot [(R_{30} + r_3) \cdot V - (R_{30} + R_{40} + r_3 + r_4) \cdot e + \quad (21)$$
$$K_3 \cdot \varepsilon_3 \cdot R_{30} \cdot V - (K_3 \cdot \varepsilon_3 \cdot R_{30} + K_4 \cdot \varepsilon_4 \cdot R_{40}) \cdot e] -$$
$$K_2 \cdot \varepsilon_2 \cdot R_{20} \cdot [(R_{40} + r_4) \cdot V + (R_{30} + R_{40} + r_3 + r_4) \cdot e +$$
$$K_4 \cdot \varepsilon_4 \cdot R_{40} \cdot V + (K_3 \cdot \varepsilon_3 \cdot R_{30} + K_4 \cdot \varepsilon_4 \cdot R_{40}) \cdot e] +$$
$$K_3 \, \varepsilon_3 \cdot R_{30} \cdot [(R_{10} + r_1) \cdot V - (R_{10} + R_{20} + r_1 + r_2) \cdot e] -$$
$$K_4 \cdot \varepsilon_4 \cdot R_{40} \cdot [(R_{20} + r_2) \cdot V + (R_{10} + R_{20} + r_1 + r_2) \cdot e] =$$
$$\frac{(R_{10} + r_1) \cdot (R_{30} + R_{40} + r_3 + r_4)^2 \cdot V \cdot (e - e_0)}{(R_{40} + r_4) \cdot V + (R_{30} + R_{40} + r_3 + r_4) \cdot e_0}$$

The equation (21) is a general formula which correlates the strains $\varepsilon_n$ corresponding to the changes $\Delta R_n$ in the resistances of the strain gages $G_n$ (n=1, 2, 3, 4) as the arms of the bridge B, and the output voltage e and initial unbalanced output voltage $e_0$ of the bridge B.

The one-gage two-wire method, the one-gage three-wire method, and the two-gage common-dummy method will be analyzed on the basis of the bridge B shown in FIG. 5 and the equation (21).

The bridge 7 based on the one-gage two-wire method shown in FIG. 1 is equivalent to a modified circuit of the bridge B shown in FIG. 5 where the strain gages $G_{2-G4}$ are kept in a strain-free state ($\Delta R_2 = \Delta R_3 = \Delta R_4 = 0$), the reference resistances $R_{10}$–$R_{40}$ of the strain gages $G_1$–$G_4$ are equalized to the reference resistance $R_0$ of the strain gage 1 and the resistances $R_2$–$R_4$ of the resistors 4–6 of the bridge 7 shown in FIG. 1, the resistances $r_{21}$, $r_{22}$, $r_{31}$, $r_{32}$, $r_{41}$, $r_{42}$ of the leads $L_{21}$, $L_{22}$, $L_{31}$, $L_{32}$, $L_{41}$, $L_{42}$ of the strain gages $G_2$–$G_4$ are set to "0", and the resistances $r_{11}$, $r_{12}$ of the leads $L_{11}$, $L_{12}$ of the strain gage $G_1$ are equalized to the resistances $r_{a1}$, $r_{a2}$ of the leads 2, 3 of the strain gage 1 shown in FIG. 1.

Therefore, with respect to the bridge 7 based on the one-gage two-wire method shown in FIG. 1, the following equation (22) is satisfied which is derived from the equation (21) by setting $\varepsilon_2=\varepsilon_3=\varepsilon_4=0$ and $r_2=r_{34}=0$, replacing $R_{10}$–$R_{40}$ with $R_0$, $R_2$, $R_3$, $R_4$, respectively, and replacing the total resistance $r_1$ (=$r_{11}+r_{12}$) of the leads $L_{11}$, $L_{12}$ of the strain gage $G_1$ with the total resistance r (=$r_{a1}+r_{a2}$) of the leads 2, 3 of the strain gage 1 of the bridge 7. The strain $\varepsilon_1$ and gage factor $K_1$ of the strain gage $G_1$, which are used in the equation (21), are replaced with the strain $\varepsilon$ and gage factor K of the strain gage 1 of the bridge 7.

$$K \cdot \varepsilon \cdot R_0 \cdot [R_3 \cdot V - [R_3 + R_4) \cdot e] = \frac{(R_0 + r) \cdot (R_3 + R_4)^2 \cdot V \cdot (e - e_0)}{R_4 \cdot V + (R_3 + R_4) \cdot e_0} \quad (22)$$

The following equation (23) is derived from the equation (22):

$$\varepsilon = \frac{V}{K} \cdot \frac{(R_3 + R_4)^2 \cdot (e - e_0)}{[R_3 \cdot V - (R_3 + R_4) \cdot e] \cdot [R_4 \cdot V + (R_3 + R_4) \cdot e_0]} \cdot \frac{R_0 + r}{R_0} \quad (23)$$

$$= \left[ \frac{V}{K} \cdot \frac{e - e_0}{\left( \frac{R_3}{R_3 + R_4} \cdot V - e \right) \cdot \left( \frac{R_4}{R_3 + R_4} \cdot V + e_0 \right)} \right] \cdot \frac{R_0 + r}{R_0}$$

For illustrative purposes, the calculated value in the larger brackets of the equation (23) is represented by $\varepsilon_a$ as follows:

$$\varepsilon_a = \frac{V}{K} \cdot \frac{e - e_0}{\left( \frac{R_3}{R_3 + R_4} \cdot V - e \right) \cdot \left( \frac{R_4}{R_3 + R_4} \cdot V + e_0 \right)} \quad (24)$$

If r=0 in the equation (23), or more generally, if the total resistance r of the leads 2, 3 of the strain gage 1 which are incorporated in the same arm of the bridge 7 as the strain gage 1 is sufficiently smaller than the reference resistance $R_0$ of the strain gage 1 ($r/R_0 \approx 0$), then $\varepsilon_a$ determined by the equation (24) represents the strain $\varepsilon$ of the object (=the strain of the strain gage 1) that is determined from the output voltage of the bridge 7 produced when the strain of the object to which the strain gage 1 is applied is measured and the initial unbalanced output voltage $e_0$ of the bridge 7. Stated otherwise, the equation (24) is a basic formula for determining the strain $\varepsilon_a$ of the object (in its original sense) from the output voltage e of the bridge 7 while canceling the effect of the initial unbalanced output voltage $e_0$.

If $R_3=R_4$ in the equation (24) as with the conventional strain measuring methods, then the following equation (25) is derived:

$$\varepsilon_a = \frac{4V}{K} \cdot \frac{e - e_0}{(V - 2e) \cdot (V + 2e_0)} \quad (25)$$

If V=2 (V) and K=2, then the equation (25) is rewritten as:

$$\varepsilon_a = \frac{e - e_0}{(1 - e) \cdot (1 + e_0)} \quad (26)$$

It should be noted that the equations (25), (26) are not the same as the equations (10), (11) which were used to cancel the effect of the initial unbalanced output voltage $e_0$ according to the conventional strain measuring methods. If $e_0=0$ in the equations (25), (26), then the equations (25), (26) are in accord with the basic equations (8), (9) used in the conventional strain measuring methods.

The value produced by multiplying $\varepsilon_a$ determined by the equation (24) by ($R_0+r)/R_0$, i.e., the strain $\varepsilon$ calculated by the equation (23), is represented by $\varepsilon_b$ ($\varepsilon_b=\varepsilon_a \cdot (R_0+r)/R_0$). The equation (23) for determining $\varepsilon_b$ serves to determine the strain $\varepsilon_b$ (in its original sense) while canceling the effect of the total resistance r of the leads 2, 3 of the strain gage 1 of the bridge 7, more specifically, a reduction in the sensitivity due to the total resistance, as well as the effect of the initial unbalanced output voltage $e_0$, if the total resistance r of the leads 2, 3 is relatively large as compared with the reference resistance $R_0$ of the strain gage 1.

The one-gage three-wire method will now be analyzed below. The bridge 9 based on the one-gage three-wire method shown in FIG. 2 is equivalent to a modified circuit of the bridge B shown in FIG. 5 where the strain gages $G_2$–$G_4$ are kept in a strain-free state ($\Delta R_2=\Delta R_3=\Delta R_4=0$), the reference resistances $R_{10}$–$R_{40}$ of the strain gages $G_1$–$G_4$ are equalized to the reference resistance $R_0$ of the strain gage 1 and the resistances $R_2$–$R_4$ of the resistors 4–6 of the bridge 9 shown in FIG. 2, the resistance $r_{12}$ of the lead $L_{12}$ of the strain gage $G_1$, the resistance $r_{22}$ of the lead $L_{22}$ of the strain gage $G_2$, and the resistances $r_{31}$, $r_{32}$, $r_{41}$, $r_{42}$ of the leads $L_{31}$, $L_{32}$, $L_{41}$, $L_{42}$ of the strain gages $G_3$, $G_4$ are set to "0", and the resistance $r_{11}$ of the lead $L_{11}$ of the strain gage $G_1$ and the resistance $r_{21}$ of the lead $L_{21}$ of the strain gage $G_2$ are equalized to the resistances $r_{a1}$, $r_{a2}$ of the leads 2, 3 of the strain gage 1 shown in FIG. 2.

Therefore, with respect to the bridge 9 based on the one-gage three-wire method shown in FIG. 2, the following equation (27) is satisfied which is derived from the equation (21) by setting $\epsilon_2=\epsilon_3=\epsilon_4=0$ and $r_3=r_4=0$, replacing $R_{10}$–$R_{40}$ with $R_0$, $R_2$, $R_3$, $R_4$, respectively, and replacing the total resistance $r_1(=r_{11}+r_{12})$ of the leads $L_{11}$, $L_{12}$ of the strain gage $G_1$ and the total resistance $r_2$ $(=r_{21}+r_{22})$ of the leads $L_{21}$, $L_{22}$ of the strain gage $G_2$ with the respective resistance $r_{a1}$, $r_{a2}$ of the leads 2, 3 of the strain gage 1 of the bridge 9. The strain $\epsilon_1$ and gage factor $K_1$ of the strain gage $G_1$, which are used in the equation (21a), are replaced with the strain $\epsilon$ and gage factor K of the strain gage 1 of the bridge 9.

$$K \cdot \varepsilon \cdot R_0 \cdot [R_3 \cdot V - (R_3 + R_4) \cdot e] = \frac{(R_0 + r_{a1}) \cdot (R_3 + R_4)^2 \cdot V \cdot (e - e_0)}{R_4 + V + (R_3 + R_4) \cdot e_0} \quad (27)$$

From the equation (27), the following equation (28) is derived:

$$\varepsilon = \frac{V}{K} \cdot \frac{(R_3 + R_4)^2 \cdot (e - e_0)}{[R_3 \cdot V - (R_3 + R_4) \cdot e] \cdot [R_4 \cdot V + (R_3 + R_4) \cdot e_0]} \cdot \frac{R_0 + e_{a1}}{R_0} \quad (28)$$

$$= \left[ \frac{V}{K} \cdot \frac{e - e_0}{\left(\frac{R_3}{R_3 + R_4} \cdot V - e\right) \cdot \left(\frac{R_4}{R_3 + R_4} \cdot V + e_0\right)} \right] \cdot \frac{R_0 + r_{a1}}{R_0}$$

If $r_{a1}=0$ in the equation (28), or more generally, if the resistance $r_{a1}$ of the lead 2 which is incorporated in the same arm of the bridge 9 as the strain gage 9 is sufficiently smaller than the reference resistance $R_0$ of the strain gage 1 ($r_{a1}/R_0 \approx 0$), then the right-hand side of the equation (28) is the same as the calculated value in the larger brackets of the equation (23), and agrees with the equation (24).

Therefore, the equation (24) is also a basic formula for determining the strain $\epsilon_a$ from the output voltage e of the bridge 9 while canceling the effect of the initial unbalanced output voltage $e_0$, according to the one-gage three-wire method.

The equation (28) for determining a value $(=\epsilon_a \cdot (R_0+r_{a1})/R_0)$ produced by multiplying $\epsilon_a$ determined by the equation (24) by $(R_0+r_{a1})/R_0$ serves to determine the strain $\epsilon$ (which corresponds to the strain $\epsilon_b$ according to the one-gage two-wire method) while canceling the effect of the resistance $r_{a1}$ of the lead 2 of the strain gage 1 of the bridge 9, more specifically, a reduction in the sensitivity due to the resistance $r_{a1}$, as well as the effect of the initial unbalanced output voltage $e_0$, if the resistance $r_{a1}$ of the lead 2 is relatively large as compared with the reference resistance $R_0$ of the strain gage 1.

If r in the equation (23) is considered to represent the total resistance of the leads (the leads 2, 3 according to the one-gage two-wire method and the lead 2 according to the one-gage three-wire method) in the same arm as the strain gage 1 of the bridges 7, 9, then the equation (23) is effective for not only the one-gage two-wire method, but also the one-gage three-wire method.

The two-gage common-dummy method will be analyzed below. The bridge 13 based on the two-gage common-dummy method shown in FIG. 3 is equivalent to a modified circuit of the bridge B shown in FIG. 5 where the strain gages $G_2$–$G_4$ are kept in a strain-free state ($\Delta R_2 = \Delta R_3 = \Delta R_4 = 0$), the reference resistances $R_{10}$–$R_{40}$ of the strain gages $G_1$–$G_4$ are equalized to the reference resistance $R_0$ of the strain gage 1, the reference resistance $R_d$ of the dummy gage 10, and the resistances $R_3$, $R_4$ of the resistors 5, 6 of the bridge 13 shown in FIG. 3, the resistances $r_{31}$, $r_{32}$, $r_{41}$, $r_{42}$ of the leads $L_{31}$, $L_{32}$, $L_{41}$, $L_{42}$ of the strain gages $G_3$, $G_4$ are set to "0", and the resistances $r_{11}$, $r_{12}$ of the leads $L_{11}$, $L_{12}$ of the strain gage $G_2$ and the resistances $r_{21}$, $r_{22}$ of the leads $L_{21}$, $L_{22}$ of the strain gage $G_2$ are equalized respectively to the resistances $r_{a1}$, $r_{a2}$ of the leads 2, 3 of the strain gage 1 and the resistances $r_{d1}$, $r_{d2}$ of the leads 11, 12 of the dummy gage 10 shown in FIG. 3.

Therefore, with respect to the bridge 13 based on the two-gage common-dummy method shown in FIG. 3, the equation (22) for the one-gage two-wire method is satisfied which is derived from the equation (21) by setting $\epsilon_2=\epsilon_3=\epsilon_4=0$ and $r_3=r_4=0$, replacing $R_{10}$–$R_{40}$ with $R_0$, $R_2$, $R_3$, $R_4$, respectively, and replacing the total resistance $r_1$ $(=r_{11}+r_{12})$ of the leads $L_{11}$, $L_{12}$ of the strain gage $G_1$ and the total resistance $r_2$ $(=r_{21}+r_{22})$ of the leads $L_{21}$, $L_{22}$ of the strain gage $G_2$ respectively with the total resistance r $(=r_{a1}+r_{a2})$ of the leads 2, 3 of the strain gage 1 and the total resistance $(=r_{d1}+r_{d2})$ of the leads 11, 12 of the strain gage 10 of the bridge 13. Therefore, the equation (23) for the one-gage two-wire method is also satisfied. If the total resistance r of the leads 2, 3 of the strain gage 1 is r=0 in the equation (23), or more generally, if the total resistance r of the leads 2, 3 is sufficiently smaller than the reference resistance $R_0$ of the strain gage 1 ($r/R_0 \approx 0$), then the equation (24) is satisfied.

Therefore, for any of the one-gage two-wire method, the one-gage three-wire method, and the two-gage common-dummy method, the equation (24) is a basic formula for determining the strain $\epsilon_a$ from the output voltage e of the bridges 7, 9, 13 upon strain measurement while canceling the effect of the initial unbalanced output voltage $e_0$ of the bridges 7, 9, 13 if the total resistance of the leads (the leads 2, 3 according to the one-gage two-wire method and the two-gage common-dummy method and the lead 2 according to the one-gage three-wire method) in the same arm as the stain gage 1 is sufficiently smaller than the reference resistance $R_0$ of the strain gage 1.

In the bridges 7, 9, 13 respectively according to the one-gage two-wire method, the one-gage three-wire method, and the two-gage common-dummy method, the total resistance of the leads (the leads 2, 3 according to the one-gage two-wire method and the two-gage common-dummy method and the lead 2 according to the one-gage three-wire method) in the same arm as the stain gage 1 is considered to be represented by r in the equation (23). In this case, the equation (23) serves as a formula for determining the strain $\epsilon(=\epsilon_b)$ from the output voltage e of the bridges 7, 9, 13 upon strain measurement while canceling the effect of the resistance of the leads of the strain gage 1, more specifically, a reduction in the sensitivity due to the lead resistance, as well as the effect of the initial unbalanced output voltage $e_0$ of the bridges 7, 9, 13.

Based on the above findings, the present invention will be described below. The reference characters given below in the parentheses are reference characters used in FIGS. 1 through 3 of the accompanying drawings for a better understanding of the present invention.

To achieve the above objects, there is provided in accordance with the present invention a method of measuring strain of an object with a bridge (7, 9, 13) having in an arm thereof a strain gage (1) applied to the object for producing a resistance change depending on the strain developed in the object, and resistors (4, 5, 6 according to the one-gate method, and 10, 5, 16 according to the two-gage common-dummy method) in respective remaining three arms thereof, the resistors having respective resistances independent of the strain developed in the object, the bridge (7, 9, 13) having a pair of power corners ($I_1$, $I_2$) respectively at a pair of diagonally opposite joints thereof and a pair of signal corners ($O_1$, $O_2$) respectively at a pair of other diagonally opposite joints thereof, the method comprising the steps of detecting an output voltage between the signal corners ($O_1$, $O_2$) as an initial unbalanced output voltage $e_0$ of the bridge while no strain is being detected by the strain gage, applying a power supply voltage between the power corners ($I_1$, $I_2$) of the bridge and detecting an output voltage e between the signal corners ($O_1$, $O_2$) to detect strain of the object, and measuring strain developed in the object based on a value $\epsilon_a$ determined using the detected output voltage e and the initial unbalanced output voltage $e_0$ according to the above equation (24). In the equation (24), V represents the power supply voltage applied between the power corners ($I_1$, $I_2$) of the bridge (7, 9, 13), K the gage factor of the strain gage (1), $R_3$ the resistance of the resistor (5) in the arm of the bridge (7, 9, 13) which is opposite to the arm with the strain gage (1), and $R_4$ the resistance of the resistor (6) in the arm of the bridge (7, 9, 13) which is positioned adjacent to the arm with the strain gage (1) across one of the power corners.

When the equation (24) is calculated using the output voltage e of the bridge (7, 9, 13) upon strain measurement and the initial unbalanced output voltage $e_0$, the effect of the initial unbalanced output voltage $e_0$ of the bridge (7, 9, 13) on strain measurement can appropriately be canceled, and strain of the object can be measured highly accurately based on the value $\epsilon_a$ determined by the equation (24).

In the equation (24), the resistances of the arms of the bridge (7, 9, 13) are not required to be equal to each other. Therefore, the strain gage and the resistors of the bridge (7, 9, 13) may basically be of any resistances insofar as they allow the bridge (7, 9, 13) to generate a detectable output voltage e. Particularly, the reference voltage of the strain gage (1) applied to the object and the resistance of the resistor in the arm opposite to the resistor (6) having the resistance $R_4$ (the resistance of the resistor (4) according to the one-gate method and the resistance of the dummy gage (10) according to the two-gage dummy method) have nothing to do with the calculation of the equation (24). Thus, the strain gage (1) and the resistor (4) or (10) do not need to be of highly accurate resistance. As a consequence, the bridge used for strain measurement may be highly flexible as to its circuit component requirements, and hence a strain measuring device for carrying out the method may be manufactured relatively inexpensively.

According to the present invention, therefore, strain of the object can accurately be measured from the output voltage of the bridge while adequately canceling the effect of the initial unbalanced output voltage of the bridge, making it possible to construct an inexpensive and simple strain measuring system.

The gage factor K of the strain gage (1), which is used in the calculation of the equation (24), may be of a value depending on the material, etc. of the strain gage (1). The power supply voltage V in the equation (24) may be of a value predetermined as a voltage to be applied to the bridge (7, 9, 13) or a measured value of the power supply voltage V. The resistances $R_3$, $R_4$ in the equation (24) may be measured resistances or nominal resistances of the resistors (5, 6) if the resistances of the resistors (5, 6) are highly accurate.

The bridge may comprise a bridge based on either one of a one-gate two-wire method, a one-gage three-wire method, and a two-gage common-dummy method.

The resistance $R_3$ of the resistor (5) in the arm of the bridge (7, 9, 13) which is opposite to the arm with the strain gage (1) and the resistance $R_4$ of the resistor (6) in the arm of the bridge which is positioned adjacent to the arm with the strain gage (1) across one of the power corners ($I_1$) may be different from each other, but should preferably be substantially the same as each other. Preferably, the power supply voltage V applied between the power corners of the bridge (7, 9, 13) is substantially 2 (V), and the gage factor K of the strain gage is substantially 2. With this arrangement, the equation (24) may be simplified into the equation (25) or (26). As a result, the effect of the initial unbalanced output voltage $e_0$ of the bridge (7, 9, 13) can be canceled according to a simpler calculation.

$V \cdot R_3/(R_3+R_4)$ in the denominator of the right-hand side of the equation (24) represents a voltage that is generated across the arm having the resistor (5) having the resistance $R_3$ when the power supply voltage V is applied to the bridge (7, 9, 13). Similarly, $V \cdot R_4/(R_3+R_4)$ in the denominator of the right-hand side of the equation (24) represents a voltage that is generated across the arm having the resistor (6) having the resistance $R_4$ when the power supply voltage V is applied to the bridge (7, 9, 13). The sum of the voltage generated across the arm having the resistor (5) having the resistance $R_3$ and the voltage that is generated across the arm having the resistor (6) having the resistance $R_4$ is equal to the power supply voltage V.

According to the present invention, the method further comprises the steps of, while the power supply voltage V is being applied between the power corners ($I_1$, $I_2$) of the bridge (7, 9, 13), detecting at least one of a voltage $V_3$ produced across the arm of the bridge (1) which is opposite to the arm with the strain gage (1) and a voltage $V_4$ produced across the arm of the bridge (7, 9, 13) which is positioned adjacent to the arm with the strain gage (1) across one of the power corners ($I_1$), and calculating the equation (24) using the detected voltage $V_3$ or $V_4$ according to one of the following equations (29), (30), and (31):

$$\varepsilon_a = \frac{V}{K} \cdot \frac{e - e_0}{(V_3 - e) \cdot [(V - V_3) + e_0]} \qquad (29)$$

$$\varepsilon_a = \frac{V}{K} \cdot \frac{e - e_0}{[(V - V_4) - e] \cdot (V_4 + e_0)} \qquad (30)$$

$$\varepsilon_a = \frac{V}{K} \cdot \frac{e - e_0}{(V_3 - e) \cdot (V_4 + e_0)}. \qquad (31)$$

By detecting either of the voltage $V_3$ produced across the arm of the bridge (1) which is opposite to the arm with the strain gage (1) and the voltage $V_4$ produced across the arm of the bridge (7, 9, 13) which is positioned adjacent to the arm with the strain gage (1) across one of the power corners ($I_1$), even if the resistances $R_3$, $R_4$ of the resistors (5, 6) in those arms are unknown, when any of the equations (29)–(31) is calculated using the detected voltage $V_3$ and/or $V_4$, strain of the object can be measured while canceling the effect of the initial unbalanced output voltage $e_0$. The voltage $V_3$ produced across the arm of the bridge (1) which is opposite to the arm with the strain gage (1) and the voltage $V_4$ produced across the arm of the bridge (7, 9, 13) which is positioned adjacent to the arm with the strain gage (1) across one of the power corners ($I_1$) contain the effect of the resistance of a circuit pattern by which the resistors (5, 6) in those arms are incorporated in the bridge (7, 9, 13). Therefore, the effect of the resistance of the circuit pattern is also canceled for more accurately strain measurement. Because the effect of the resistance of the circuit pattern is also canceled, if the method of measuring strain according to the present invention is applied to a strain measuring device, then it is not necessary to take measures in the strain measuring device to cancel the resistance of the circuit pattern, and hence the strain measuring device can be manufactured relatively inexpensively.

If both the voltages $V_3$, $V_4$ are detected, then the sum (=$V_3+V_4$) of the detected values of the voltages $V_3$, $V_4$ may be used as the value of V in the equation (31).

The equation (25), which is equal to the equation (24) where $R_3=R_4$, may be rewritten as the following equation (32):

$$\varepsilon_a = \left[\frac{4V}{K} \cdot \frac{e-e_0}{(V-2e)\cdot(V-2e_0)}\right] \cdot \frac{V-2e_0}{V+2e_0} \tag{32}$$

The term in the brackets of the equation (32) is replaced with $\varepsilon_p$ as shown in the following equation (33):

$$\varepsilon_p = \frac{4V}{K} \cdot \frac{e-e_0}{(V-2e)\cdot(V-2e_0)} \tag{33}$$

The value $\varepsilon_p$ determined by the equation (33) is nothing but the value determined by the equation (10) used heretofore to determine strain $\varepsilon$ while canceling the effect of the initial unbalanced output voltage $e_0$ of the bridge (7, 9, 13) based on the premise that $R_0=R_2=R_3=R_4$ in the bridges 7, 9 according to the one-gage two-wire method and the one-gate three-wire method shown respectively in FIGS. 1 and 2 and that $R_0=R_d=R_3=R_4$ in the bridge 13 according to the two-gate common-dummy method shown in FIG. 3.

That is, the value $\varepsilon_p$ determined by the equation (33) is produced by subtracting under the above conditions a value go determined according to the following equation (34) based on the equation (8) as apparent strain $\varepsilon_0$ corresponding to the initial unbalanced output voltage $e_0$ of the bridge (7, 9, 13), from a value $\varepsilon$ determined by the equation (8) from the output voltage e of the bridge (7, 9, 13) upon strain measurement, as with the conventional process.

$$\varepsilon_0 = \frac{4}{K} \cdot \frac{e_0}{V-2e_0} \tag{34}$$

If the initial unbalanced output voltage $e_0$ is expressed using $\varepsilon_0$, then the following equation (35) is derived from the equation (34):

$$e_0 = \frac{K \cdot \varepsilon_0 \cdot V}{2 \cdot (2 + K \cdot \varepsilon_0)} \tag{35}$$

From the equation (35), the term $(V-2e_0)/(V+2e_0)$ other than the term in the brackets of the equation (32) is expressed by the following equation (36) using the value $\varepsilon_0$ determined according to the equation (34)

$$\frac{V-2e_0}{V+2e_0} = \frac{1}{1+K\cdot\varepsilon_0} \tag{36}$$

From the equations (32), (33), the equation (24) for determining strain $\varepsilon_0$ while canceling the effect of the initial unbalanced output voltage $e_0$ of the bridge (7, 9, 13) may be expressed as the following equation (37) if the value $\varepsilon_p$ determined by the equation (33) to cancel the effect of the initial unbalanced output voltage $e_0$ is used and also the value $e_0$ determined by the equation (34) is used as the apparent strain $e_0$ corresponding to the initial unbalanced output voltage $e_0$:

$$\varepsilon_a = \frac{1}{1+K\cdot\varepsilon_0}. \tag{37}$$

According to the present invention, each of the resistances of the resistors (the resistors 4, 5, 6 according to the one-gage method and the resistors 10, 5, 6 according to the two-gage common-dummy method) in the respective remaining three arms of the bridge (7, 9, 13), other than the arm with the strain gage, is substantially the same as the reference resistance ($R_0$) of the strain gage (1) when no strain is being detected by the strain gage (1), and the method further comprises the steps of calculating the equation (33) using the output voltage e produced between the signal corners when strain is measured and the initial unbalanced output voltage $e_0$, calculating the equation (34) using the initial unbalanced output voltage $e_0$, calculating the equation (24) using a value $\varepsilon_p$ determined by the equation (33) and a value $\varepsilon_0$ determined by the equation (34), according to the equation (37).

By calculating the equation (24) according to the equation (37), it is possible to determine strain $\varepsilon_a$ while canceling the effect of the initial unbalanced output voltage $e_0$ of the bridge (7, 9, 13), from the value $\varepsilon_p$ determined by the equation (33) to cancel the effect of the initial unbalanced output voltage $e_0$ and the value $\varepsilon_0$ determined by the equation (34) as the apparent strain $\varepsilon_0$ corresponding to the initial unbalanced output voltage $e_0$.

According to the present invention, the strain gage is connected to the resistors (the resistors (4, 2) according to the one-gage method and the resistors (5, 10) according to the two-gage common-dummy method) by a pair of leads (2, 3) connected to respective terminals of the strain gage (1), at least one of the leads (the leads (2,3) according to the one-gage method and the two-gage common-dummy method and the lead (2) according to the one-gate three wire method) being placed in the same arm as the strain gage (1), and the method further comprises the step of measuring the strain developed in the object based on a value $\varepsilon_b$ which is produced by multiplying the determined value $\varepsilon_a$ by a ratio ($R_0$+r)/$R_0$ of the sum ($R_0$+r) of the reference resistance $R_0$ of the strain gage when no strain is being detected by the strain gage and the total resistance r of the lead (the leads (2, 3) according to the one-gage method and the two-gage common-dummy method and the lead (2) according to the one-gate three wire method) placed in the same arm as the strain gage to the reference resistance $R_0$.

In this manner, strain is measured on the basis of the value $\varepsilon(=\varepsilon_b)$ calculated according to the equation (23). As a consequence, it is possible to cancel the effect of the resistance of the lead (in the same arm as the strain gage) connected to the stain gage (1), i.e., a reduction in the sensitivity due to the resistance of the lead, as well as the effect of the initial unbalanced output voltage $e_0$ of the bridge (7, 9, 13). Consequently, strain can be measured highly accurately even if the lead has a relatively large resistance.

The reference resistance $R_0$ of the strain gage (1) required to determine the value b may be a predetermined reference resistance (nominal value) of the strain gage 1 or a pre-measured reference resistance of the strain gage 1. The total resistance r of the lead may be of a pre-measured value thereof or a value determined from the material, length, thickness, etc. of the lead. Furthermore, if a voltage VG is applied to the strain gage (1) and a voltage Vr is applied to the lead in the same arm as the strain gage (1) when the power supply voltage V is applied to the bridge (7, 9, 13) while no strain is being detected by the strain gage (1), then the relationship $(R_o+r)/R_0=(V_G+V_r)/V_G$ is obviously satisfied. Therefore, the voltages $V_G$, $V_r$ may be measured, and the value of a ratio $(V_G+V_r)/V_G$ based on the measured voltages $V_G$, $V_r$ may be used as the value of a ratio $(R_o+r)/R_0$ based on the reference resistance $R_0$ of the strain gage (1) and the resistance r of the lead.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
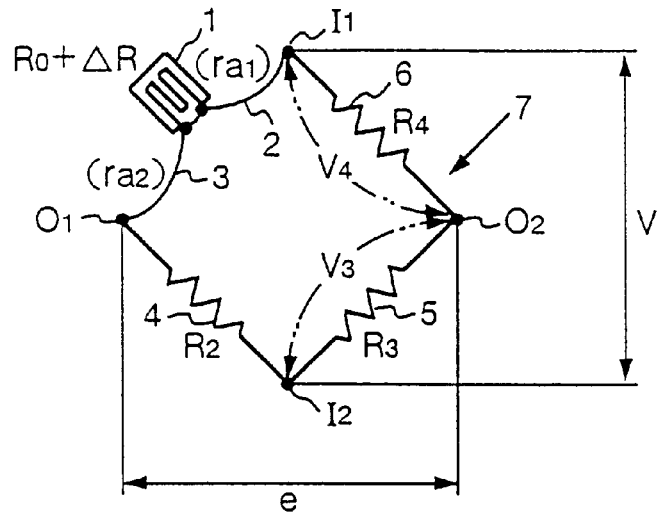
FIG. 1 is a circuit diagram illustrative of a one-gage two-wire method for strain measurement.

A method of measuring strain according to a first embodiment of the present invention will be described below with reference to FIGS. 6 and 7. The method of measuring strain according to the first embodiment of the present invention is a one-gage two-wire method. Those parts shown in FIG. 6 which are identical to those shown in FIG. 1 are denoted by identical reference characters.

Figure 6:
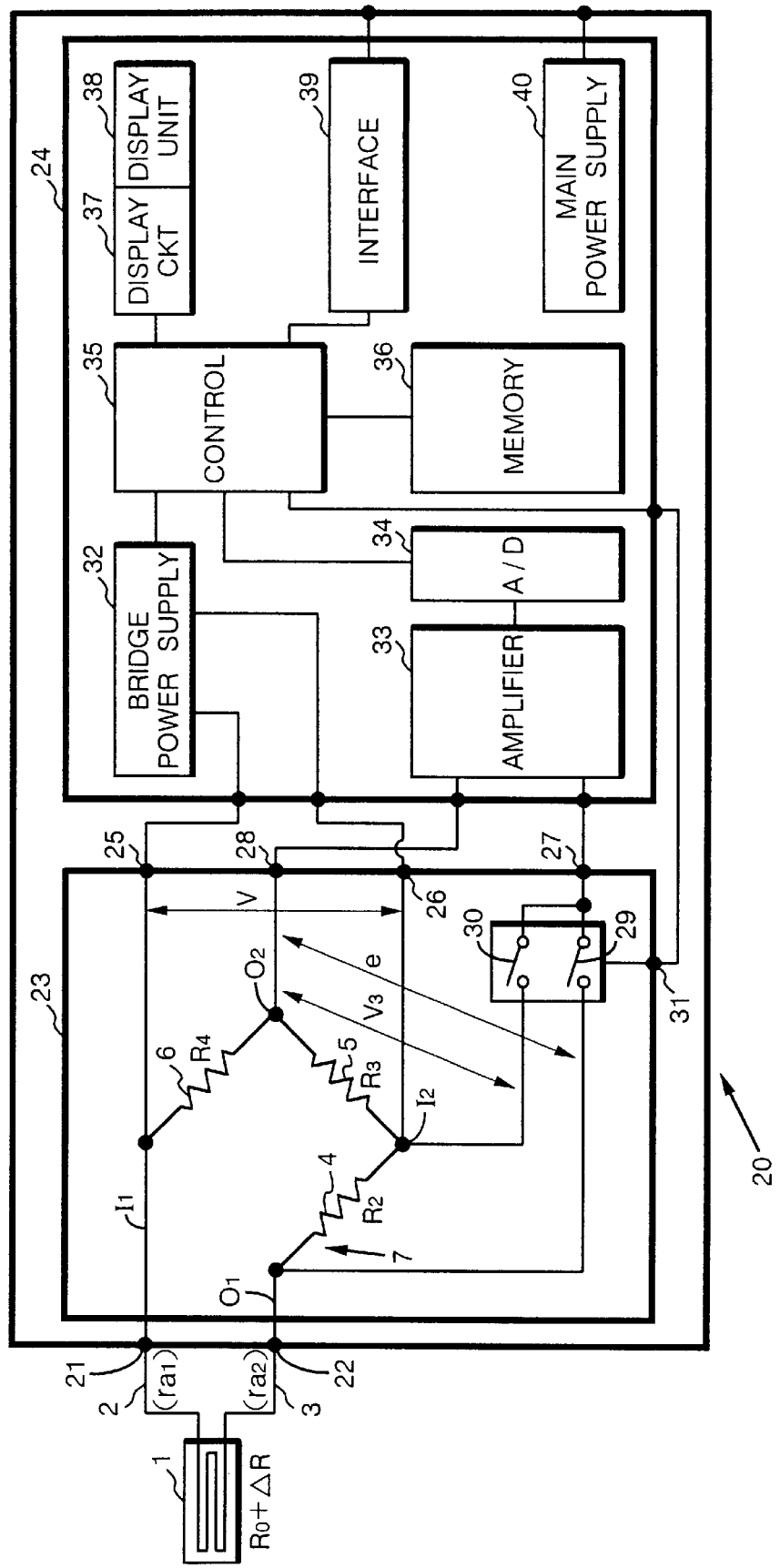
FIG. 6 is a block diagram of a strain measuring device used to carry out a method of measuring strain according to a first embodiment of the present invention.

As shown in FIG. 6, a strain measuring device 20 has a pair of connection terminals 21, 22 for connection to respective leads 2, 3 connected to respective terminals of a strain gage 1 that is applied to an object whose strain is to be measured.

The strain measuring device 20 basically comprises a measuring unit 23 and a control unit 24, which may or may not be integrally combined with each other.

The measuring unit 23 has three resistors 4, 5, 6 that cooperate with the strain gage 1 in making up a bridge 7. The resistors 4, 5, 6 comprise respective resistive elements having respective fixed resistances. The resistors 4, 5, 6 are interconnected by a circuit pattern on a circuit board (not shown) and connected to the connection terminals 21, 22 such that when the leads 2, 3 of the strain gage 1 are connected to the connection terminals 21, 22, respectively, the resistors 4, 5, 6 and the strain gage 1 jointly make up the bridge 7.

The measuring unit 23 also has a pair of power input terminals 25, 26 for applying a power supply voltage V from an external power supply between a pair of power corners $I_1$, $I_2$ of the bridge 7, and a pair of signal output terminals 27, 28 for outputting either an output voltage e generated between a pair of signal corners $O_1$, $O_2$ of the bridge 7 or a voltage $V_3$ produced across an arm with the resistor 5 of the bridge 7.

The power input terminals 25, 26 are connected respectively to the power corners $I_1$, $I_2$ of the bridge 7. The signal output terminal 28 is connected to the signal corner $O_2$, and the signal output terminal 27 is connected to the other signal corner $O_1$ and the power corner $I_2$ through respective switches 29, 30 that can be turned on and turned off by an external control signal.

With the power supply voltage V being applied to the bridge 7, when the switches 29, 30 are turned on and turned off, respectively, an output voltage e produced by the bridge 7 appears between the signal output terminals 27, 28, and when the switches 29, 30 are turned off and turned on, respectively, a voltage $V_3$ produced across the arm with the resistor 5 appears between the signal output terminals 27, 28.

The measuring unit 23 also has a control terminal 31 for applying a control signal from a controller 35 of the control unit 24 to the switches 29, 30 for selectively turning them on and off.

The control unit 24 has a bridge power supply 32 connected to the power input terminals 25, 26 of the measuring unit 23 for generating the power supply voltage V (constant voltage) to be applied between the power corners $I_1$, $I_2$ of the bridge 7 through the power input terminals 25, 26, an amplifier 33 connected to the signal output terminals 27, 28 for amplifying the voltage e or $V_3$ appearing between the signal output terminals 27, 28, an A/D converter 34 for converting an analog output signal from the amplifier 33 to a digital signal, a controller 35 for carrying out various data and control processing, a memory 36 for storing various data and a program to be run by the controller 35, a display unit 38 energizable by the controller 35 through a display circuit 37 for displaying a measured value of strain and other information, an interface 39 for sending various data from the controller 35 to and to the controller 35 from an external control console or an external personal computer (not shown) of the control unit 24, and a main power supply 40 for generating a power supply voltage for the control unit 24 from a commercial power supply. The controller 35 comprises a microprocessor or the like, and the memory 36 comprises a ROM, a RAM, an EEPROM, etc. The amplifier 33 has a sufficiently large input impedance. The main power supply 40 for the control unit 24 may comprise a battery.

The controller 35 calculates an equation (38), shown below, using data representing an initial unbalanced output voltage $e_0$ of the bridge 7 which is supplied through the amplifier 33 and the A/D converter 34, the output voltage e produced by the bridge 7 upon strain measurement, and the voltage $V_3$ produced across the arm with the resistor 5, for thereby determining strain $\epsilon$ developed in the object to which the strain gage 1 is applied.

$$\varepsilon = \left[\frac{V}{K} \cdot \frac{e - e_0}{(V_3 - e) \cdot (V - V_3 + e_0)}\right] \cdot \frac{R_0 + r}{R_0} \quad (38)$$

The calculation of the equation (38) is the same as the calculation of the term in the larger brackets on the right-hand side of the equation (23) according to the equation (29). Stated otherwise, the calculation of the equation (38) is the same as the determination of the value $\epsilon_b$, which is obtained when the value $\epsilon_a$ produced by the equation (29) is multiplied by $(R_0+r)/R_0$ (where $r = r_{a1}+r_{a2}$), as the strain $\epsilon$.

Figure 7:
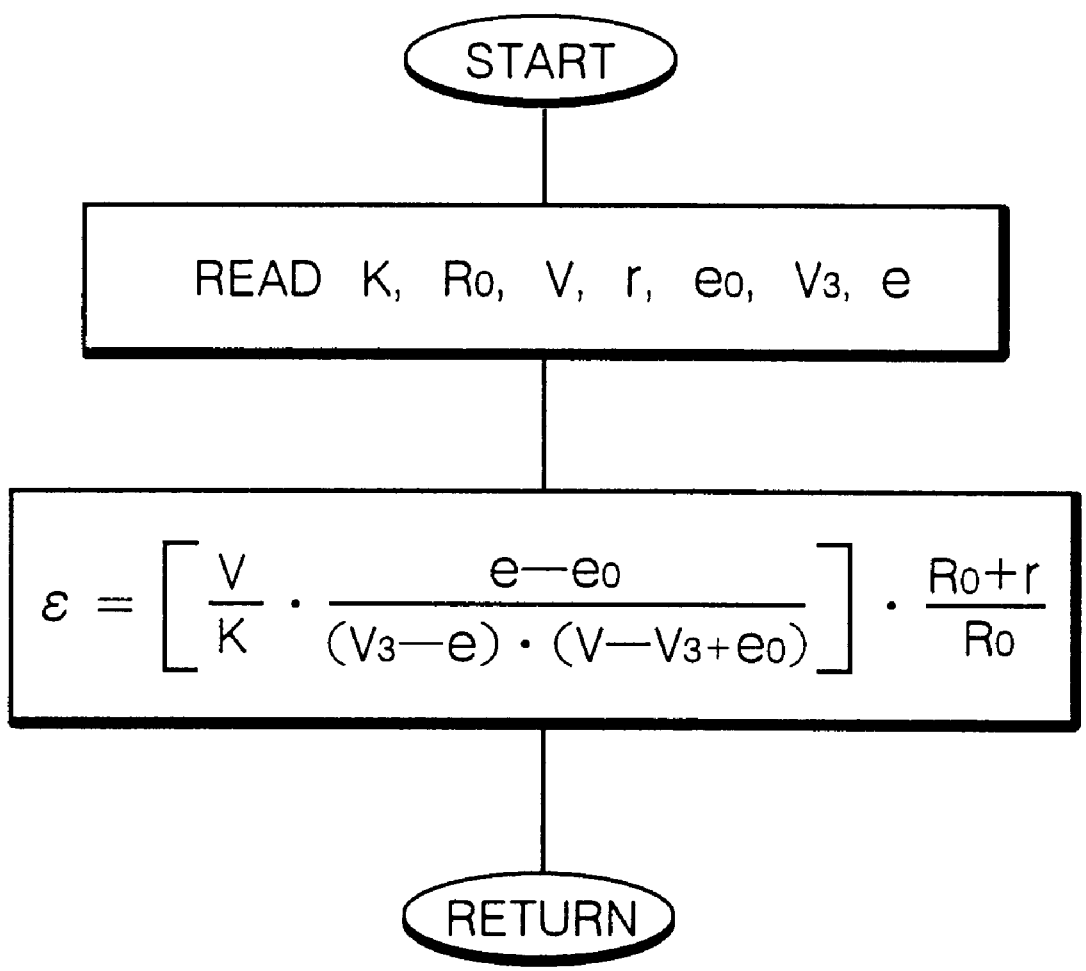
FIG. 7 is a flowchart of a processing sequence of the strain measuring device shown in FIG. 6.

The memory 36 stores a processing sequence shown in FIG. 7 for enabling the controller 35 to carry out the above calculating process.

Operation of the strain measuring device 20 shown in FIG. 6 will be described in detail below.

Prior to a strain measuring process, the values of the gage factor K and the reference resistance $R_0$ of the strain gage 1, the power supply voltage V to be applied from the bridge power supply 32 to the bridge 7, and the total resistance r $(= r_{a1}+r_{a2})$ of the leads 2, 3 (in the same arm as the strain gage 1) that connect the strain gage 1 to the connection terminals 21, 22 to incorporate the stain gage 1 into the bridge 7 are entered by the operator from the external control console or the like through the interface 39 and the controller 35 into the memory 36, which stores the entered values.

At this time, the value of the gage factor K to be stored in the memory 36 is a predetermined value as the gage factor K of the strain gage 1 used with the strain measuring device 20 or a normal value of the gage factor K of the strain gage 1 used with the strain measuring device 20. The value of the reference resistance $R_0$ of the strain gage 1 is a normal value thereof or a reference resistance value actually measured of the strain gage 1. Similarly, the value of the power supply voltage V is a predetermined value as a power supply voltage to be applied from the bridge power supply 32 to the power corners $I_1$, $I_2$ of the bridge 7 or a value actually measured of the power supply voltage. The total resistance r of the leads 2, 3 is the sum of resistances actually measured of the leads 2, 3 or a value determined from the material, length, thickness, etc. of the leads 2, 3.

Since the value of the power supply voltage V, for example, of the data stored in the memory 36 is inherent in the strain measuring device 20, it may be stored in the ROM of the memory 36 when the strain measuring device 20 is manufactured.

Thereafter, the leads 2, 3 are connected respectively to the connection terminals 2, 3 while the strain gage 1 is not being applied to the object whose strain is to be measured, and then the strain measuring device 20 is operated in a predetermined manner to energize the control unit 24.

The controller 35 then starts the bridge power supply 32 to apply the power supply voltage V through the power input terminals 25, 26 between the power corners $I_1$, $I_2$ of the bridge 7.

The controller 35 then turns on and off the switches 29, 30, respectively, to allow an output voltage e produced between the signal corners $O_1$, $O_2$ to be applied through the signal output terminals 27, 28 to the amplifier 33. The controller 35 detects the output voltage e from data supplied through the amplifier 33 and the A/D converter 34, and stores the detected output voltage e as an initial unbalanced output voltage $e_0$ of the bridge 7 in the memory 36.

Thereafter, the controller 35 turns off and off the switches 29, 30, respectively, to allow a voltage $V_3$ produced across the arm with the resistor 5 to be applied through the signal output terminals 27, 28 to the amplifier 33. The controller 35 detects the voltage $V_3$ from data supplied through the amplifier 33 and the A/D converter 34, and stores the detected voltage $V_3$ in the memory 36. The voltage $V_3$ may be detected and stored after the strain gage 1 is applied to the object or before the strain gage 1 is connected to the strain measuring device 20.

Then, after the strain gage 1 is applied to the object, the controller 35 measures strain produced in the object at a time indicated by the user or according to a predetermined time schedule, as follows:

The controller 35 applies the power supply voltage V through the power input terminals 25, 26 between the power corners $I_1$, $I_2$ of the bridge 7. The controller 35 then turns on and off the switches 29, 30, respectively, to allow an output voltage e produced between the signal corners $O_1$, $O_2$ to be applied through the signal output terminals 27, 28 to the amplifier 33. The controller 35 detects the output voltage e from data supplied through the amplifier 33 and the A/D converter 34, and stores the detected output voltage e in the memory 36.

The controller 35 then carries out the processing sequence shown in FIG. 7 which is stored in the memory 36 for determining strain $\epsilon$ (in its original sense) developed in the object.

Specifically, the controller 35 reads the stored data of the gage factor K and the reference resistance $R_0$ of the strain gage 1, the power supply voltage V to be applied to the bridge 7, the sum $r (= r_{a1}+r_{a2})$ of the resistances $r_{a1}$, $r_{a2}$ of the leads 2, 3, the initial unbalanced output voltage $e_0$ of the bridge 7, the voltage $V_3$ produced across the arm with the resistor 5, and the output voltage e produced by the bridge 7 upon strain measurement, from the memory 36.

Using the read data, the controller 35 calculates the equation (38) to determine strain $\epsilon$.

The controller 35 then displays the determined strain $\epsilon$ on the display unit 38 through the display circuit 37.

Since the strain $\epsilon$ is determined according to the equation (38), it is possible to cancel the effect of the initial unbalanced output voltage $e_0$ of the bridge 7, more specifically, the effect which the initial unbalanced output voltage $e_0$ has on the measured accuracy of the strain $\epsilon$ based on the output voltage e, without depending on the resistances of the arms of the bridge 7, according to the calculation in the brackets of the equation (38), i.e., the calculation of the equation (29). Furthermore, because the value which is obtained when the value produced by the calculation in the brackets of the equation (38) is multiplied by $(R_0+r)/R_0$ is determined as the strain $\epsilon$, a reduction in the sensitivity due to the resistances $r_{a1}$, $r_{a2}$ of the leads 2, 3 by which the strain gage 1 is connected to the strain measuring device 20 can also be canceled. As a consequence, the strain $\epsilon$ determined by the equation (38) is highly accurate.

Inasmuch as the initial unbalanced output voltage $e_0$ of the bridge 7 can be canceled without depending on the resistances of the arms of the bridge 7, the strain measuring device 20 does not need to use a strain gage and resistors having highly accurate resistances as the strain gage 1 and the resistors 4, 5, 6 in the respective arms of the bridge 7, may employ a strain gage and resistors having various resistances. Moreover, because the resistances of the arms of the bridge 7 are not relied upon, it is not necessary to take into account the resistance of the circuit pattern which interconnects the resistors 4, 5, 6. As a result, the strain gage 1 and the measuring unit 23 can be manufactured relatively inexpensively.

Figure 8:
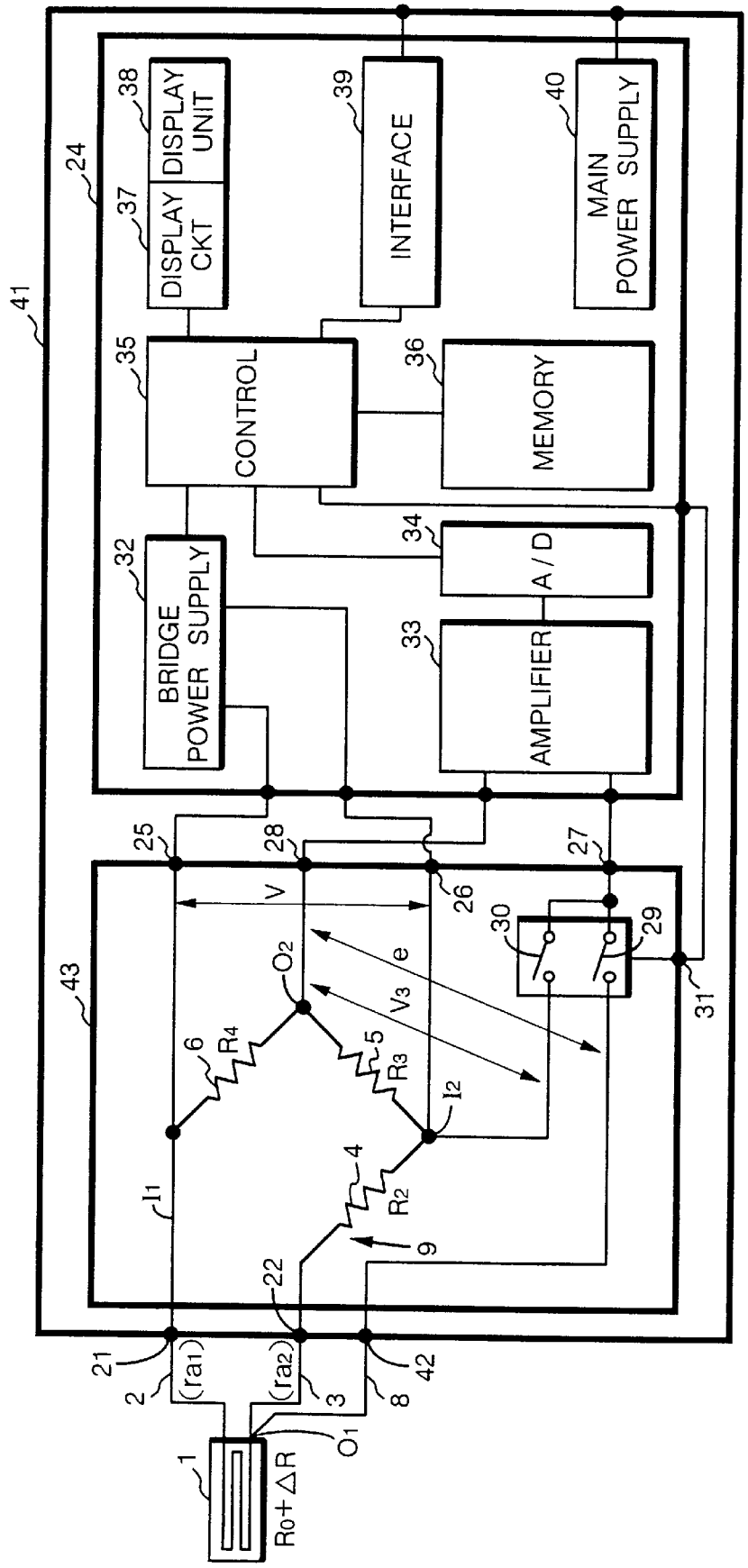
FIG. 8 is a block diagram of a strain measuring device used to carry out a method of measuring strain according to a second embodiment of the present invention.

A method of measuring strain according to a second embodiment of the present invention will be described below with reference to FIG. 8. FIG. 8 shows in block form a strain measuring device used to carry out the method of measuring strain according to the second embodiment of the present invention. The method of measuring strain according to the second embodiment of the present invention is a one-gage three-wire method. Those parts shown in FIG. 8 which are identical to those of the strain measuring device 20 shown in FIG. 6 are denoted by identical reference characters, and will not be described in detail below.

As shown in FIG. 8, a strain measuring device 41 has a pair of connection terminals 21, 22 for connection to respective leads 2, 3 connected to respective terminals of a strain gage 1 that is applied to an object whose strain is to be measured, and a connection terminal 42 for connection to an auxiliary lead 8 that is connected to the terminal of the strain gage 1 to which the lead 3 is connected.

As with the strain measuring device 20 shown in FIG. 6, the strain measuring device 41 comprises a measuring unit 43 and a control unit 24. The control unit 24 has a circuit arrangement that is identical to the control unit 24 of the strain measuring device 20 shown in FIG. 6.

The measuring unit 43 is basically similar to the measuring unit 23 of the strain measuring device 20 shown in FIG. 6 in that it has resistors 4, 5, 6 which cooperates with the strain gage 1 in making up a bridge 9, and a pair of power input terminals 25, 26 for applying a power supply voltage V between a pair of power corners $I_1$, $I_2$ of the bridge 7. The resistors 4, 5, 6 and the power input terminals 25, 26 are connected to each other in the same manner as with the measuring unit 23.

The measuring unit 43 also has a pair of signal output terminals 27, 28 connected to the amplifier 33 of the control unit 24, a pair of switches 29, 30, and a control terminal 31 for applying a control signal from the controller 35 of the control unit 24 to the switches 29, 30 for selectively turning them on and off. The strain measuring device 41 differs from the strain measuring device 20 shown in FIG. 6 in that the signal output terminal 27 is connected to the connection terminal 42, which is connected by the auxiliary lead 8 to the terminal of the strain gage 1 that serves as the signal corner $O_1$ of the bridge 9, and the power corner $I_2$ of the bridge 9 through the respective switches 29, 30. The signal output terminal 28 is connected to the signal corner $O_2$ of the bridge 9.

With the power supply voltage V being applied between the power corners $I_1$, $I_2$ of the bridge 9, when the switches 29, 30 are turned on and turned off, respectively, an output voltage e produced between signal corners $O_1$, $O_2$ appears between the signal output terminals 27, 28, and when the switches 29, 30 are turned off and turned on, respectively, a voltage $V_3$ produced across the arm with the resistor 5 appears between the signal output terminals 27, 28.

The controller 35 determines strain $\epsilon$ developed in the object according to the equation (38) as with the controller 35 of the strain measuring device 20 according the first embodiment. The memory 36 stores the processing sequence shown in FIG. 7 for enabling the controller 35 to carry out the above calculating process.

Prior to a strain measuring process, the values of the gage factor K and the reference resistance $R_0$ of the strain gage 1, and the power supply voltage V to be applied from the bridge power supply 32 to the bridge 9 are supplied to and stored in the memory 36. Furthermore, the resistance $r_{a1}$ of the lead 2 which is in the same arm as the strain gage 1 is also stored as the total resistance r of the leads which are in the same arm as the strain gage 1, in the memory 36.

Thereafter, an initial unbalanced output voltage $e_0$ of the bridge 9, a voltage $V_3$ produced across the arm with the resistor 5, and an output voltage e produced by the bridge 9 upon strain measurement are detected and stored. The controller 35 then executes the processing sequence shown in FIG. 7 stored in the memory 36 to determine strain $\epsilon$ from the above detected data and the data of the gage factor K, etc. stored in the memory 36, and displays the determined strain $\epsilon$ on the display unit 37.

As with the first embodiment, since the strain $\epsilon$ is determined according to the equation (38), it is possible to cancel the effect of the initial unbalanced output voltage $e_0$ of the bridge 9 without depending on the resistances of the arms of the bridge 9. Furthermore, a reduction in the sensitivity due to the resistance r of the lead 2 in the same arm as the strain gage 1 can also be canceled. As a consequence, the strain $\epsilon$ can be measured highly accurately. Because the resistances of the arms of the bridge 9 are not required to be highly accurate, the strain gage 1 and the measuring unit 43 can be manufactured relatively inexpensively.

Figure 9:
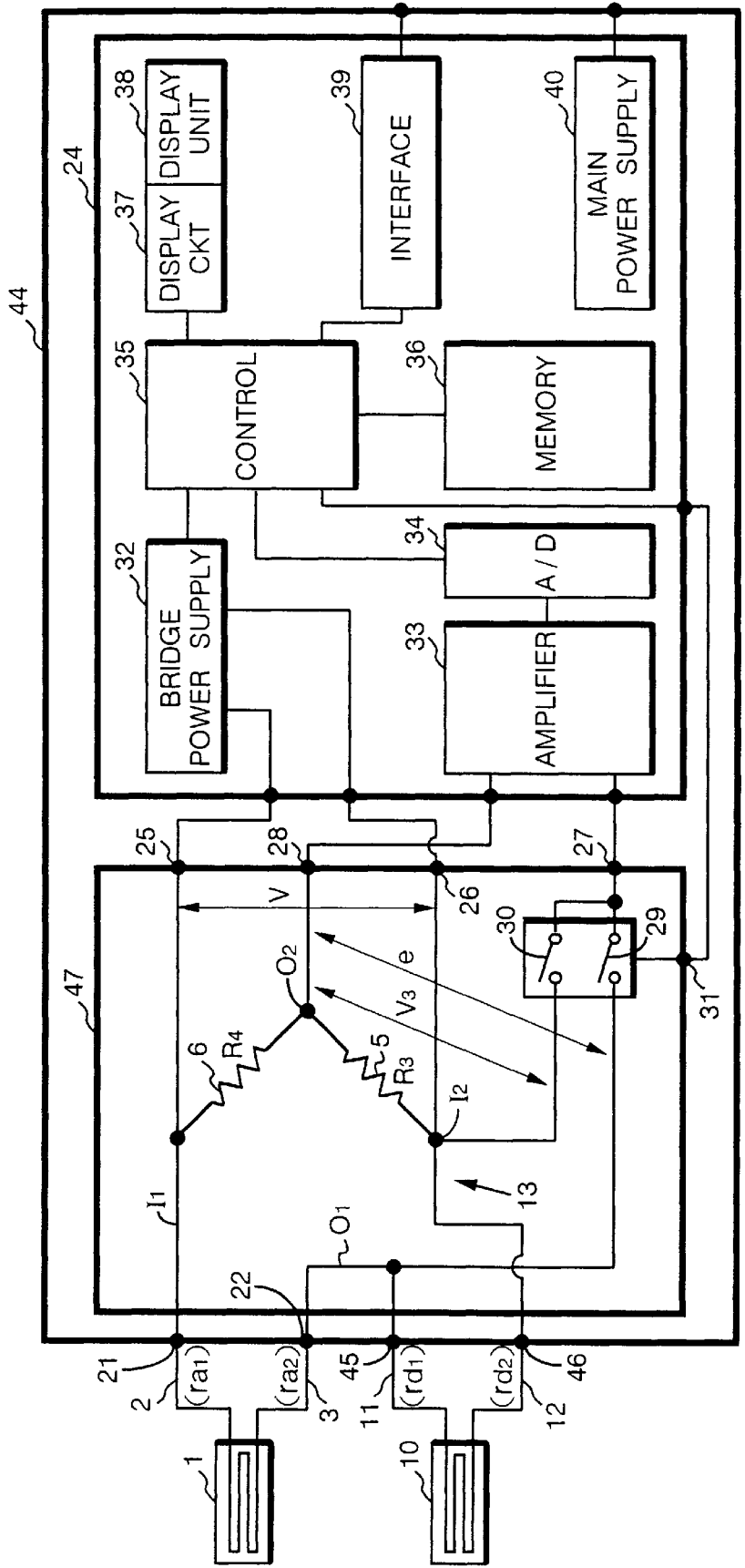
FIG. 9 is a block diagram of a strain measuring device used to carry out a method of measuring strain according to a third embodiment of the present invention.

A method of measuring strain according to a third embodiment of the present invention will be described below with reference to FIG. 9. FIG. 9 shows in block form a strain measuring device used to carry out the method of measuring strain according to the third embodiment of the present invention. The method of measuring strain according to the third embodiment of the present invention is a two-gage common-dummy method. Those parts shown in FIG. 9 which are identical to those of the strain measuring device 20 shown in FIG. 6 are denoted by identical reference characters, and will not be described in detail below.

As shown in FIG. 9, a strain measuring device 44 has a pair of connection terminals 21, 22 for connection to respective leads 2, 3 connected to respective terminals of a strain gage 1 that is applied to an object whose strain is to be measured, and a pair of connection terminals 45, 46 for connection to respective leads 11, 12 connected to respective terminals of a strain gage (dummy gage) 10 having the same characteristics as the strain gage 1.

As with the strain measuring device 20 shown in FIG. 6, the strain measuring device 44 comprises a measuring unit 47 and a control unit 24. The control unit 24 has a circuit arrangement that is identical to the control unit 24 of the strain measuring device 20 shown in FIG. 6.

Figure 3:
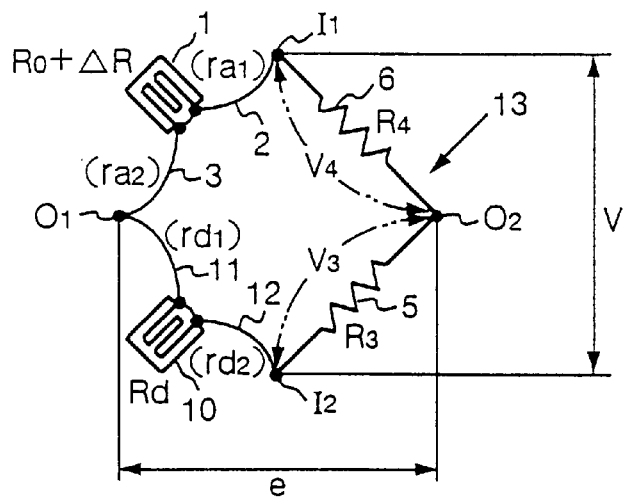
FIG. 3 is a circuit diagram illustrative of a two-gage common-dummy method for strain measurement.
Figure 4:
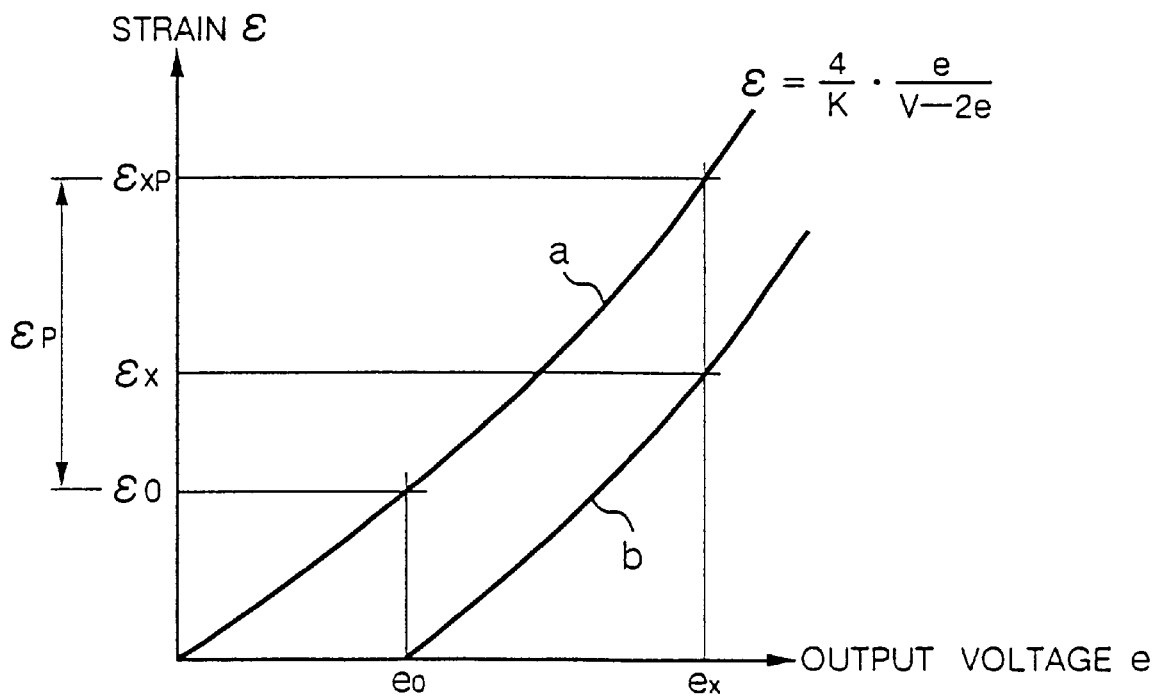
FIG. 4 is a graph showing output characteristics of a bridge for measuring strain.
Figure 5:
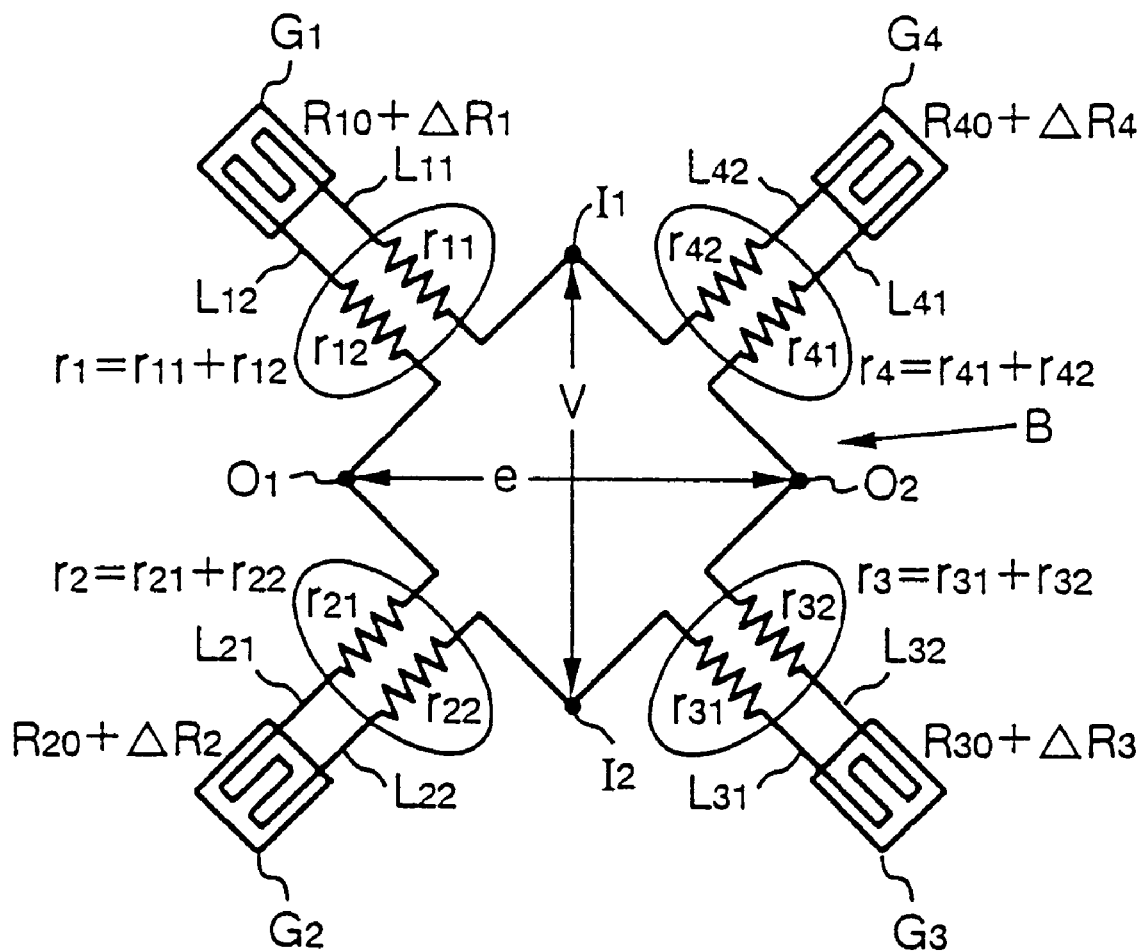
FIG. 5 is a circuit diagram illustrative of the principles of the present invention.

The measuring unit 47 has resistors 5, 6 which cooperate with the strain gage 1 and the dummy gage 10 in making up a bridge 13. In the measuring unit 47, the connection terminal 22 for connection to the lead 3 connected to the strain gage 1 and the connection terminal 45 for connection to the lead 11 connected to the dummy gage 10 are connected to each other by a circuit pattern. The resistors 5, 6 are connected to each other by the circuit pattern and also to the connection terminals 21, 46, respectively, such that when the leads 2, 3 are connected respectively to the connection terminals 21, 22 and the leads 11, 12 are connected respectively to the connection terminals 45, 46, the bridge 13 is formed as shown in FIG. 3.

The measuring unit 43 has a pair of power input terminals 25, 26 connected to respective power corners $I_1$, $I_2$ of the bridge 13 for applying a power supply voltage V from the bridge power supply 32 of the control unit 24 between the power corners $I_1$, $I_2$.

The measuring unit 47 also has a pair of signal output terminals 27, 28 connected to the amplifier 33 of the control unit 24, a pair of switches 29, 30, and a control terminal 31 for applying a control signal from the controller 35 of the control unit 24 to the switches 29, 30 for selectively turning them on and off.

The signal output terminal 27 is connected to the signal corner $O_1$ of the bridge 13, i.e., the junction between the connection terminals 22, 45 in the measuring unit 47, and the power corner $I_2$ of the bridge 13 through the respective switches 29, 30. The signal output terminal 28 is connected to the signal corner $O_2$ of the bridge 13.

With the power supply voltage V being applied between the power corners $I_1$, $I_2$ of the bridge 13, when the switches 29, 30 are turned on and turned off, respectively, an output voltage e produced between signal corners $O_1$, $O_2$ appears between the signal output terminals 27, 28, and when the switches 29, 30 are turned off and turned on, respectively, a voltage $V_3$ produced across the arm with the resistor 5 appears between the signal output terminals 27, 28.

The controller 35 determines strain ε developed in the object according to the equation (38) as with the controller 35 of the strain measuring device 20 according the first embodiment. The memory 36 stores the processing sequence shown in FIG. 7 for enabling the controller 35 to carry out the above calculating process.

Prior to a strain measuring process, the values of the gage factor K and the reference resistance $R_0$ of the strain gage 1, the power supply voltage V to be applied from the bridge power supply 32 to the bridge 13, and the total resistance r ($=r_{a1}+r_{a2}$) of the leads 2, 3 of the strain gage 1 are supplied to and stored in the memory 36.

Thereafter, in exactly the same manner as the with the method of measuring strain according to the first embodiment of the present invention, an initial unbalanced output voltage $e_0$ of the bridge 13, a voltage $V_3$ produced across the arm with the resistor 5, and an output voltage e produced by the bridge 13 upon strain measurement are detected and stored. The controller 35 then executes the processing sequence shown in FIG. 7 stored in the memory 36 to determine strain ε from the above detected data and the data of the gage factor K, etc. stored in the memory 36, and displays the determined strain ε on the display unit 37.

As with the first embodiment, since the strain ε is determined according to the equation (38), it is possible to cancel the effect of the initial unbalanced output voltage $e_0$ of the bridge 9 without depending on the resistances of the arms of the bridge 9. Furthermore, a reduction in the sensitivity due to the total resistance r ($=r_{a1}+r_{a2}$) of the leads 2, 3 in the same arm as the strain gage 1 can also be canceled. As a consequence, the strain ε can be measured highly accurately. Because the resistances of the arms of the bridge 9 are not required to be highly accurate, the strain gage 1, the dummy gage 13, and the measuring unit 47 can be manufactured relatively inexpensively.

Figure 10:
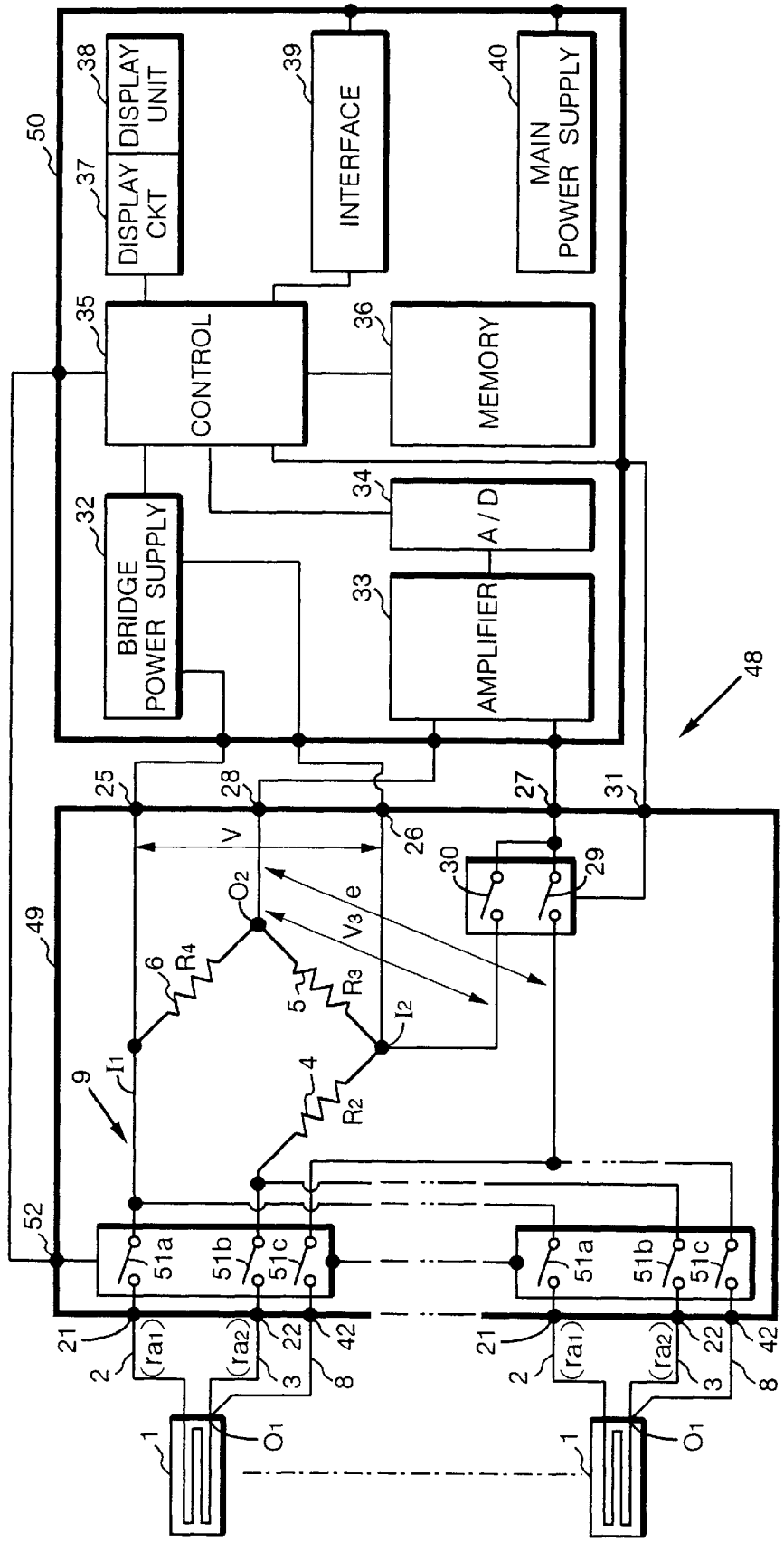
FIG. 10 is a block diagram of a strain measuring device used to carry out a method of measuring strain according to a fourth embodiment of the present invention.

A method of measuring strain according to a fourth embodiment of the present invention will be described below with reference to FIG. 10. FIG. 10 shows in block form a strain measuring device used to carry out the method of measuring strain according to the fourth embodiment of the present invention. The strain measuring device shown in FIG. 10 is basically the same as the strain measuring device 41 based on the one-gage three-wire method as shown in FIG. 8. Those parts shown in FIG. 10 which are identical to those of the strain measuring device 41 shown in FIG. 8 are denoted by identical reference characters, and will not be described in detail below.

As shown in FIG. 10, a strain measuring device 48 is a multispot strain measuring device for measuring strain on a plurality of points or a plurality of objects (hereinafter referred to as "measuring points"), not shown, according to the one-gage three-wire method. The strain measuring device 48 comprises a measuring unit 49, generally referred to as a switch box, and a control unit 50.

The measuring unit 49 has as many sets of connection terminals 21, 22, 42 as the number of measuring points, the connection terminals 21, 22, 42 in each set being connected respectively to leads 2, 3 and an auxiliary lead 8 which are connected to a strain gage 1 applied to one of the measuring points.

The measuring unit 49 also has as many sets of switches 51a, 51b, 51c as the number of sets of connection terminals 21, 22, 42, the switches 51a, 51b, 51c in each set being connected respectively to the connection terminals 21, 22, 42 connected to one of the strain gages 1. As with the measuring unit 43 shown in FIG. 8, the measuring unit 49 has resistors 4, 5, 6, switches 29, 30, a pair of power input terminals 25, 26, a pair of signal output terminals 27, 28, and a control terminal 31.

Figure 2:
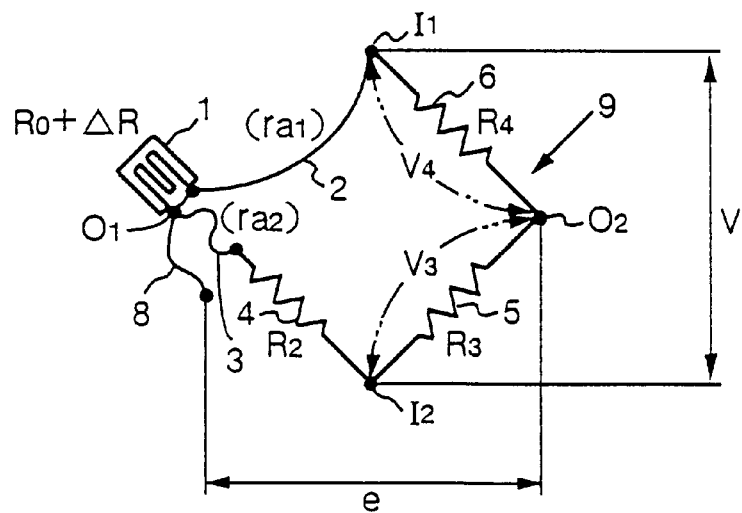
FIG. 2 is a circuit diagram illustrative of a one-gage three-wire method for strain measurement.

When the switches 51a, 51b, 51c in each set connected to one of the strain gages 1 are turned on, the connection terminals 21, 22 connected to the leads 2, 3 that are connected to the strain gage 1 are connected to the resistive circuit composed of the resistors 4, 5, 6, making up a bridge 9 shown in FIG. 2, and the connection terminal 42 connected to the auxiliary lead 8 that is connected to the strain gage 1 is connected through the switch 29 to the output terminal 27.

The switches 51a, 51b, 51c in each set are controlled for their turned-on/off states by a control signal applied to a control terminal 52 of the measuring unit 52.

The above structure of the measuring unit 49 is basically the same as the structure of the measuring unit 43 shown in FIG. 8.

The control unit 50 has a basic circuit arrangement which is the same as the control unit 24 of the strain measuring device 41 shown in FIG. 8. The control unit 50 comprises a bridge power supply 32, an amplifier 33, an A/D converter 34, a controller 35, a memory 36, a display circuit 37, a display unit 38, an interface 39, and a main power supply 40. As with the strain measuring device 41 shown in FIG. 8, the bridge power supply 32 and the amplifier 33 are connected to the measuring unit 49. The controller 35 supplies a control signal to the control terminal 52 to control the switches 51a, 51b, 51c in each set for their turned-on/off states.

The controller 35 serves to determine strain ε at each of the measuring points according to the equation (38). The memory 36 stores the processing sequence shown in FIG. 7 for enabling the controller 35 to carry out the above calculating process.

The strain measuring device 48 measures strain as follows:

Prior to a strain measuring process, the value of the power supply voltage V to be applied from the bridge 9 (common to all the measuring points) is supplied to and stored in the memory 36. The values of the gage factor K and the reference resistance $R_0$ of each of the strain gages 1 for the respective measuring points are supplied to and stored in the memory 36. The resistance $ra_1$ of the lead 2 connected to each of the strain gages 1 is supplied to and stored in the memory 36 as the total resistance r of the lead positioned in the same arm as the strain gage 1 of the bridge 9.

Thereafter, the strain gages 1 at the measuring points are connected to the measuring unit 49, but not applied to the object, and then the strain measuring device 48 is operated in a predetermined manner to energize the control unit 50.

The controller 35 then starts the bridge power supply 32 to apply the power supply voltage V through the power input terminals 25, 26 between the power corners $I_1$, $I_2$ of the bridge 9. The controller 35 then turns on and off the switches 29, 30, respectively, and then successively turns on the sets of the switches 51a, 51b, 51c corresponding to the respective strain gages 1. Therefore, the strain gages 1 are successively connected to the resistive circuit composed of the resistors 4, 5, 6, making up bridges 9 successively for the measuring points. Each time a bridge 9 is made up for one of the measuring points, an output voltage e produced between the signal corners $O_1$, $O_2$ is applied through the signal output terminals 27, 28 to the amplifier 33. The controller 35 detects the output voltage e from data supplied through the amplifier 33 and the A/D converter 34, and stores the detected output voltage e as an initial unbalanced output voltage $e_0$ of the bridge 7 in the memory 36. In this manner, the initial unbalanced output voltages $e_0$ for the bridges 9 corresponding to the respective measuring points are successively stored in the memory 36.

Thereafter, the controller 35 turns off and off the switches 29, 30, respectively, to allow a voltage $V_3$ produced across the arm with the resistor 5 to be applied through the signal output terminals 27, 28 to the amplifier 33. The controller 35 detects the voltage $V_3$ from data supplied through the amplifier 33 and the A/D converter 34, and stores the detected voltage $V_3$ (common to the bridges 9 corresponding to all the measuring points) in the memory 36. The voltage $V_3$ may be detected and stored while all the sets of the switches 51a, 51b, 51c are being turned off. Alternatively, the voltage $V_3$ may be detected and stored while the switches 51a, 51b, 51c of either one set are being turned on. Furthermore, the voltage $V_3$ may be detected and stored before the initial unbalanced output voltages $e_0$ are detected and stored, or after the strain gages 1 are applied to the respective measuring spots.

Then, after the strain gages 1 applied to the respective measuring points, the controller 35 measures strains at the respective measuring points, as follows: The controller 35 applies the power supply voltage V from the bridge power supply 32 between the power corners $I_1$, $I_2$, and turns on and off the switches 29, 30, respectively, and then successively turns on the sets of the switches 51a, 51b, 51c corresponding to the respective strain gages 1, thus making up bridges 9 successively for the measuring points. The controller 35 detects an output voltage e of the bridge 9 for each of the measuring points, from data supplied through the amplifier 33 and the A/D converter 34, and stores the detected output voltage e in the memory 36. In this manner, the output voltages e of the bridges 9 corresponding to the respective measuring points are successively stored in the memory 36.

The controller 35 then carries out the processing sequence shown in FIG. 7 which is stored in the memory 36 at each of the measuring points for determining strain $\epsilon$ at each of the measuring points.

Specifically, the controller 35 reads the stored data of the power supply voltage V to be applied to the bridge 7 (common to the measuring points) and the voltage $V_3$ across the arm with the resistor 5. The controller 36 also reads the stored data of the gage factors K and the reference resistances $R_0$ of the strain gages 1 corresponding to the measuring points, the resistances r of the leads 2, the initial unbalanced output voltages $e_0$ of the bridges 9, and the output voltages e produced by the bridges 9 upon strain measurement, from the memory 36.

Using the read data, the controller 35 calculates the equation (38) to determine strain $\epsilon$ for each of the measuring points.

The controller 35 then displays the determined strain $\epsilon$ for each of the measuring points on the display unit 38 through the display circuit 37.

Since the strain $\epsilon$ for each of the measuring points is determined according to the equation (38), it is possible to cancel the effect of the initial unbalanced output voltage $e_0$ of the bridge 9 without depending on the resistances of the arms of the bridge 9 for each of the measuring points, according to the calculation in the brackets of the equation (38). Furthermore, a reduction in the sensitivity due to the total resistances r of the leads 2 in the same arms as the strain gages 1 can also be canceled. As a consequence, the strain $\epsilon$ for each of the measuring points is measured highly accurately. Moreover, because the resistances of the arms of the bridge 9 are not required to be highly accurate, the strain gages 1 and the measuring unit 49 can be manufactured relatively inexpensively.

In the fourth embodiment, the method of measuring strain is carried out by a multispot strain measuring device according to the one-gage three-wire method. However, the principles of the fourth embodiment are also applicable to the one-gage two-wire method or the two-gage common-dummy method.

In each of the first through fourth embodiments, the voltage $V_3$ across the arm having the resistor 5 of the bridges 7, 9, 13 is detected, and the equation (38) is calculated using the detected voltage $V_3$. However, a voltage $V_4$ across the arm having the resistor 6 of the bridges 7, 9, 13 may be detected, and the calculation in the brackets of the equation (38) may be carried out using the detected voltage $V_4$ according to the equation (30). Alternatively, both the voltages $V_3$, $V_4$ may be detected, and the calculation in the brackets of the equation (38) may be carried out using the detected voltages $V_3$, $V_4$ according to the equation (31). If both the voltages $V_3$, $V_4$ are detected, then the sum ($V_3+V_4$) of the detected voltages $V_3$, $V_4$ may be used as the value of the power supply voltage V applied to the bridges 7, 9, 13 for the calculation of the equation (38).

The voltage $V_4$ across the arm having the resistor 6 of the bridges 7, 9, 13 may be detected in the same manner as the voltage $V_3$ across the arm having the resistor 5 as follows: The potential at the signal corner $O_2$ of the bridges 7, 9, 13 is applied through the output terminal 28 to the amplifier 33, and the potential at the power corner Ii of the bridges 7, 9, 13 is applied through a switch (not shown) and the output terminal 27 to the amplifier 33.

In each of the first through fourth embodiments, the voltage $V_3$ across the arm having the resistor 5 of the bridges 7, 9, 13 is detected. However, the resistances $R_3$, $R_4$ of the resistors 5, 6 of the bridges 7, 9, 13 may be stored in the memory 36, and strain $\epsilon$ may be determined using the stored resistances $R_3$, $R_4$ according to the equation (23). In this alternative, it is not necessary to detect the voltage $V_3$ across the arm having the resistor 5 or the voltage $V_4$ across the arm having the resistor 6. If the resistances $R_3$, $R_4$ of the resistors 5, 6 are equal to each other, then the calculation in the brackets of the equation (23) may be carried out according to the right-hand side of the equation (25) without using the data of the resistances $R_3$, $R_4$. Furthermore, if the power supply voltage V applied to the bridges 7, 9, 13 is V=2 (V) and the gage factor K of the strain gage 1 is K=2, then calculation in the brackets of the equation (23) may be carried out according to the right-hand side of the equation (26).

A method of measuring strain according to a fifth embodiment of the present invention will be described below with reference to FIGS. 11 and 6. The method of measuring strain according to the fifth embodiment is carried out by a strain measuring device which is identical to the strain measuring device 20 shown in FIG. 6 which carries out the method of measuring strain according to the first embodiment based on the one-gage two-wire method. The strain measuring device 20 shown in FIG. 6 will be referred to in the description of the method of measuring strain according to the fifth embodiment.

According to the fifth embodiment, the resistances $R_2$, $R_3$, $R_4$ of the resistors 4, 5, 6 of the measuring unit 23 are represented by $R_0=R_2=R_3=R_4$ where $R_0$ is the reference resistance of the strain gage 1. According to the fifth embodiment, furthermore, strain $\epsilon$ developed in the object is determined according to the following equation (39), using the value $\epsilon_p$ determined by the equation (33) and the value $\epsilon_0$ determined by the equation (34). The memory 36 stores the processing sequence shown in FIG. 11 for enabling the controller 35 to carry out the above calculating process.

$$\varepsilon = \left[\frac{1}{1+K\cdot\varepsilon_0}\cdot\varepsilon_p\right]\cdot\frac{R_0+r}{R_0} \quad (39)$$

The calculation of the equation (39) is the same as the calculation of the term in the larger brackets on the right-hand side of the equation (23) according to the equation (37). Stated otherwise, the calculation of the equation (39) is the same as the determination of the value $\epsilon_b$, which is obtained when the value $\epsilon_a$ produced by the equation (37) ($\epsilon_p$, $\epsilon_0$ used for the calculation of the equation (37) are determined respectively by the equations (33), (34)) is multiplied by $(R_0+r)/R_0$ (where $r=r_{a1}+r_{a2}$), as the strain $\epsilon$.

Other details of the method of measuring strain according to the fifth embodiment are identical to those of the method of measuring strain according to the first embodiment.

In the method of measuring strain according to the fifth embodiment, using the strain measuring device 20, as with the first embodiment, prior to a strain measuring process, the values of the gage factor K and the reference resistance $R_0$ of the strain gage 1, the power supply voltage V to be applied from the bridge power supply 32 to the bridge 7, and the total resistance r ($=r_{a1}+r_{a2}$) of the leads 2, 3 (in the same arm as the strain gage 1) connected to the strain gage 1 are supplied to and stored in the memory 36.

Furthermore, as with the first embodiment, an initial unbalanced output voltage $e_0$ of the bridge 7 and an output voltage e of the bridge 7 upon strain measurement are supplied to and stored in the memory 36. In the fifth embodiment, however, it is not necessary to detect and store the voltage $V_3$ across the arm having the resistor 5 of the bridge 7.

Figure 11:
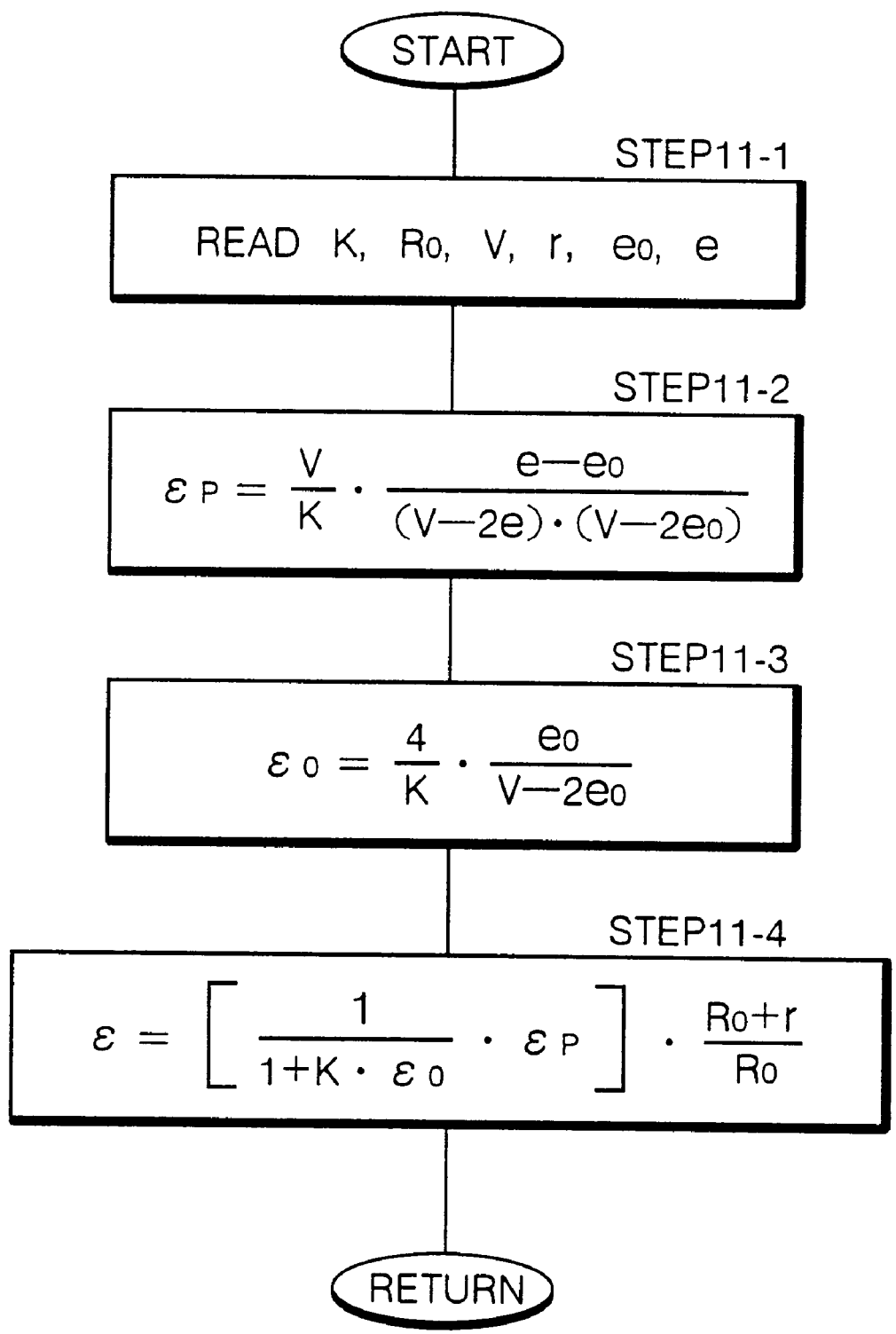
FIG. 11 is a flowchart of a processing sequence of a strain measuring device used to carry out a method of measuring strain according to a fifth embodiment of the present invention.

The controller 35 then carries out the processing sequence shown in FIG. 11 which is stored in the memory 36 for determining strain $\epsilon$ from the above detected data and the data such as of the gage factor K, etc. stored in the memory 36.

Specifically, the controller 35 reads the data of the power supply voltage V to be applied to the bridge 7, the gage factor K of the strain gage 1, the reference resistance $R_0$ of the strain gage 1, the total resistance r ($=r_{a1}+r_{a2}$) of the leads 2, 3, the initial unbalanced output voltage $e_0$ of the bridge 7, and the output voltage e of the bridge 7 upon strain measurement from the memory 36 in STEP11-1.

Then, the controller 35 calculates the equation (33) based on the data of the power supply voltage V, the gage factor K, the initial unbalanced output voltage $e_0$, and the output voltage e for thereby determining a value $\epsilon_p$ in STEP11-2. The value ep is representative of strain $\epsilon$ which has been determined according to the equation (10) as being capable of canceling the initial unbalanced output voltage $e_0$ of the bridge 7 according to the conventional strain measuring method described above.

The controller 35 then calculates the equation (34) based on the data of the power supply voltage V, the gage factor K, and the initial unbalanced output voltage $e_0$ for thereby determining a value $\epsilon_0$ in STEP11-3. The value $\epsilon_0$ is representative of apparent strain $\epsilon_0$ which has been determined as corresponding to the initial unbalanced output voltage $e_0$ of the bridge 7 according to the conventional strain measuring method described above.

The controller 35 then calculates the equation (39) based on the data of the values $\epsilon_p$, $\epsilon_0$, the gage factor K, the reference resistance $R_0$, and the total resistance r ($=r_{a1}+r_{a2}$) for thereby determining strain $\epsilon$ in STEP11-4. The controller 35 displays the determined strain $\epsilon$ on the display unit 37.

In the fifth embodiment, as with the first embodiment, the effect of the initial unbalanced output voltage $e_0$ of the bridge 7 can appropriately be canceled, and a reduction in the sensitivity due to the total resistance r ($=r_{a1}+r_{a2}$) of the leads 2, 3 in the same arm as the strain gage 1 of the bridge 7 can also be canceled. The effect of the initial unbalanced output voltage $e_0$ of the bridge 7 can appropriately be canceled by carrying out the calculation in the brackets of the equation (39), i.e., the calculation of the equation (37), using the values $\epsilon_p$, $\epsilon_0$ obtained according to the conventional strain measuring method. Therefore, the strain measuring device can measure strain highly accurately simply by modifying slightly the processing sequence employed by the conventional strain measuring device.

In the fifth embodiment, it is not necessary to detect the voltage $V_3$ across the arm having the resistor 5 of the bridge 7. Consequently, the switches 29, 30 may be dispensed wit and the output terminal 27 may be connected to only the signal corner $O_1$ of the bridge 7.

The method of measuring strain according to the fifth embodiment has been described with respect to the one-gage two-wire method, for example. However, according to the one-gage three-wire method or the two-gage common-dummy method, strain $\epsilon$ can be also be determined by the equation (39) while canceling the effect of the initial unbalanced output voltage $e_0$ and a reduction in the sensitivity due to the resistances of the leads 2, 3. In this case, the resistances of the arms of the bridges 9, 13 are represented by $R_0=R_2=R_3=R_4$ according to the one-gage three-wire method, and by $R_0=R_d=R_3=R_4$ according to the two-gage common-dummy method, as with the one-gage two-wire method.

In each of the first through fifth embodiments, a reduction in the sensitivity due to the resistance r of the lead (the leads 2, 3 according to the one-gage two-wire method and the two-gage common-dummy method and the lead 2 according to the one-gage three-wire method) in the same arm as the strain gage 1 of the bridges 7, 9, 13 is canceled. However, if the resistance r of the lead is sufficiently smaller than the reference resistance $R_0$ of the strain gage 1, then strain $\epsilon$ may be determined by the equation (24), the equations (29)–(30), or the equation (37).

In each of the first through fifth embodiments, the value of the ratio $(R_0+r)/R_0$ for canceling a reduction in the sensitivity due to the resistance r of the lead positioned in the same arm as the strain gage 1 is determined directly using the reference resistance $R_0$ of the strain gage 1 and the resistance r of the lead. However, the value of the ratio $(R_0+r)/R_0$ may be determined as follows: With no strain being measured by the strain gage 1, a voltage $V_G$ produced by the strain gage 1 when the power supply voltage V is applied to the bridges 7, 9, 13 and a voltage $V_r$ produced across the lead in the same arm as the strain gage 1 are measured. Then, the value of a ratio $(V_G+V_r)/V_G$ based on these measured voltages $V_G$, $V_r$ is used as the value of the ratio $(R_0+r)/R_0$ for canceling a reduction in the sensitivity due to the resistance r of the lead.

In the second and fourth embodiments based on the one-gage three-wire method, the resistance $r_{a1}$ of the lead 2 is used as the resistance r of the lead positioned in the same arm as the strain gage 1. Generally, since the leads 2, 3 connected to the strain gage 1 are of the same length and of the same wire type, their resistances $r_{a1}$, $r_{a2}$ are substantially equal to each other. Therefore, in the second and fourth embodiments based on the one-gage three-wire method, the value r/2 of half of the total resistance r $(=r_{a1}+r_{a2})$ of the leads 2, 3 may be used as the resistance r of the lead positioned in the same arm as the strain gage 1.

In each of the first through fifth embodiments, the method of determining strain determines strain $\epsilon$ in its original sense. However, stress may be determined by multiplying the strain $\epsilon$ calculated according to the equation (38) or (39) by the Young's modulus E of the object to which the strain gage 1 is applied.

A method of measuring strain according to a sixth embodiment of the present invention will be described below with reference to FIGS. 12 and 13.

Figure 12:
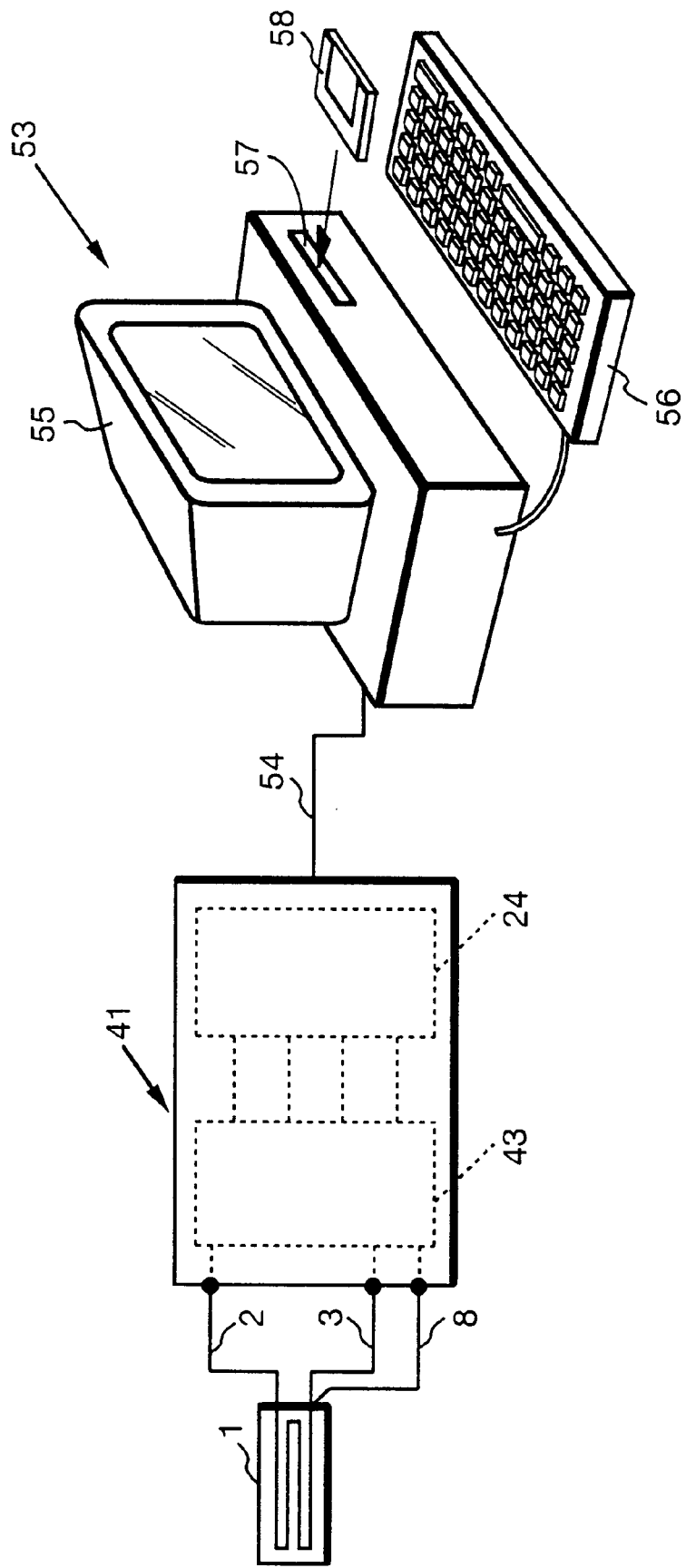
FIG. 12 is a perspective view, partly in block form, of a strain measuring system used to carry out a method of measuring strain according to a sixth embodiment of the present invention.

As shown in FIG. 12, a strain measuring system used to carry out the method of measuring strain according to the sixth embodiment comprises a strain measuring device 41 for carrying out the one-gage three-wire method as shown in FIG. 8, and a personal computer 53. The personal computer 53 is connected by a communication cable 54 to the interface 39 (see FIG. 8) of the control unit 24 of the strain measuring device 41 for communicating with the control unit 24. The personal computer 53 may be an ordinary personal computer or a workstation.

The controller 35 (see FIG. 8) of the control unit 24 transmits the data, stored in the memory 36, which are indicative of the initial unbalanced output voltage $e_0$ of the bridge 9, the voltage $V_3$ across the arm having the resistor 5 of the bridge 9, and the output voltage e of the bridge 9 upon strain measurement, to the personal computer 53.

In the sixth embodiment, the strain measuring device 41 is not required to calculate strain $\epsilon$. Therefore, the memory 36 is not required to store the program for calculating the equation (38) and the data of the gage factor K and the reference resistance $R_0$ of the strain gage 1, the power supply voltage V to be applied to the bridge 9, and the resistance $r_{a1}$ (=r) of the lead 2, which are used in the calculation of the equation (38).

The personal computer 53 comprises a display unit 55, a keyboard 56, and a slot 57 for inserting a floppy disk (hereinafter referred to as an "FD slot 57"). The personal computer 53 can be supplied with the data of the initial unbalanced output voltage e, of the bridge 9, the voltage $V_3$ across the arm having the resistor 6 of the bridge 9, and the output voltage e of the bridge 9 upon strain measurement through the communication cable 54. The data of the gage factor K and the reference resistance $R_0$ of the strain gage 1, the power supply voltage V to be applied to the bridge 9, and the resistance $r_{a1}$ (=r) of the lead 2 can be entered into the personal computer 56 through the keyboard 56.

Figure 13:
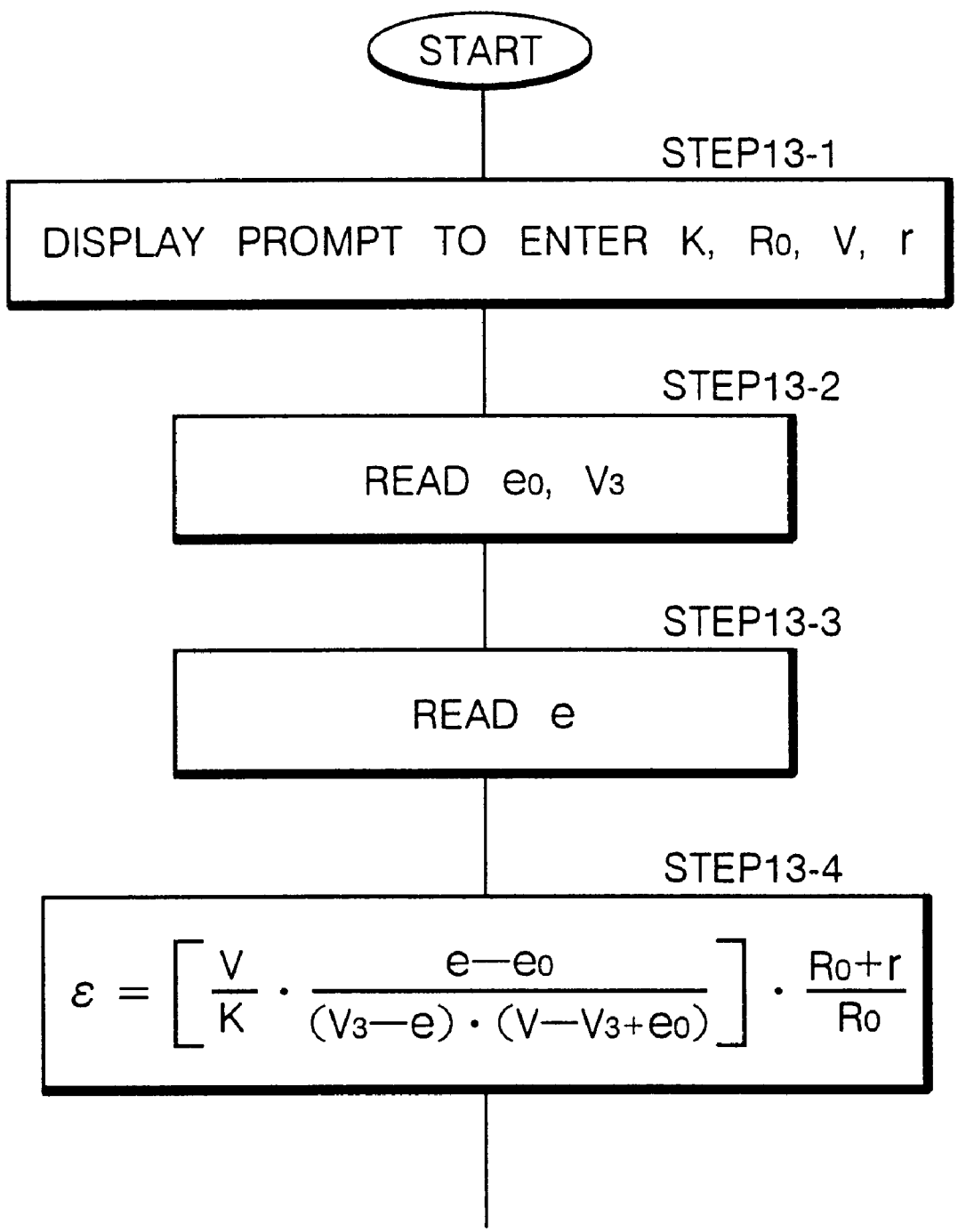
FIG. 13 is a flowchart of a major processing sequence of an application program recorded in a recording medium which is used by the strain measuring system shown in FIG. 12.

A floppy disk 58 is used as a recording medium which stores an application program for enabling the personal computer 53 to effect a strain measurement analysis including the processing sequence shown in FIG. 13.

The strain measuring system shown in FIG. 12 operates as follows: After a strain measurement process carried out by the strain measuring device 41 is finished, the strain measuring device 41 is connected to the personal computer 53 by the communication cable 54. The floppy disk 58 is inserted into the FD slot 57, and the application program stored in the FD slot 57 is started.

The application program enables the personal computer 53 to execute the following process:

As shown in FIG. 13, the application program enables the person computer 53 to display a prompt to enter the gage factor K and the reference resistance $R_0$ of the strain gage 1, the power supply voltage V to be applied to the bridge 9, and the resistance $r_{a1}$ (=r) of the lead 2 on the display unit 55 in STEP13-1.

When the data are entered through the keyboard 56 in response to the displayed prompt, the application program controls the personal computer 53 to read the data of the initial unbalanced output voltage $e_0$ of the bridge 9 and the voltage $V_3$ across the arm having the resistor 5 of the bridge 9, which are stored in the memory 36, through the communication cable 54 in STEP13-2.

The application program also enables the personal computer 53 to read the data of a succession of output voltages e, detected at different times, of the bridge 9 upon measurement from the memory 36 in STE213-3.

The application program then enables the personal computer 53 to carry out the calculation of the equation (38) based on the data read into the personal computer 53 in STEP13-1 and the data read into the personal computer 53 in STEP13-2, STEP13-3, for thereby calculating strains E corresponding to the respective data of the output voltages e of the bridge 9 in STEP13-4.

Thereafter, the application program causes the personal computer 53 to analyze the data of the calculated strains E and display the calculated strains $\epsilon$ on the display unit 55.

Since the application program is stored in the floppy disk 58 which is portable, the strain measuring process can be effected in a wide range of applications using the personal computer 53.

While the floppy disk 58 is used as a recording medium in the illustrated embodiment, another recording medium such as a CD-ROM or the like may be used for storing the application program.

In the sixth embodiment, the data are transferred from the strain measuring device 41 to the personal computer 53 through the communication cable 54. However, the data may be recorded on a recording medium such as a floppy disk or the like by the strain measuring device 41, and the data may be transferred to the personal computer 53 by the recording medium.

In the sixth embodiment, the strain measuring device 41 is illustrated as measuring strain according to the one-gage three-wire method. However, the recording medium storing the application program may be used in combination with the strain measuring device based on the one-gate two-wire method or the strain measuring device based on the two-gage common-dummy method. Furthermore, the strain measuring device 48 as the multispot strain measuring device may measure strain using the recording medium storing the application program that can be run by a personal computer.

In the sixth embodiment, strain $\epsilon$ is calculated according to the equation (38). However, if the voltage $V_4$ across the arm having the resistor 6 of the bridges 7, 9, 13 is detected by the strain measuring device, then an application program for carrying out the calculation in the brackets of the equation (38) according to the equation (30) may be recorded in the recording medium. Furthermore, if both the voltage $V_3$ across the arm having the resistor 5 and the voltage $V_4$ across the arm having the resistor 6 of the bridges 7, 9, 13 are detected by the strain measuring device, then an application program for carrying out the calculation in the brackets of the equation (38) according to the equation (31) may be recorded in the recording medium.

Moreover, if neither the voltage $V_3$ nor the voltage $V_4$ is detected, then an application program for entering the resistances $R_3$, $R_4$ of the resistors 5, 6 into the personal computer and determining strain $\epsilon$ according to the equation (23) may be recorded in the recording medium.

In the sixth embodiment, strain $\epsilon$ is calculated according to the equation (38). However, if the resistances $R_2$–$R_4$ of the resistors 4–6 of the bridges 7, 9 according to the one-gage method are equal to the reference resistance $R_0$ of the strain gage 1, and the reference resistance $R_d$ of the dummy gage 10 and the resistances $R_3$, $R_4$ of the resistors 5,6 of the bridge circuit 13 according to the two-gage common-dummy method are equal to the reference resistance $R_0$ of the strain gage 1, then as with the fifth embodiment, an application program for determining strain $\epsilon$ according to the equation (39), rather than the equation (38), e.g., an application program where the processing of STEP13-4 shown in FIG. 13 is replaced with the processing of STEP11-2–STEP11-4 shown in FIG. 11, may be recorded in the recording medium.

In the sixth embodiment, strain $\epsilon$ in its original sense is measured. However, stress may be measured using the personal computer if an application program for entering the Young's modulus E and multiplying the calculated strain $\epsilon$ by the Young's modulus E is recorded in the recording medium.

Although certain preferred embodiments of the present invention have been shown and described in detail, it should be understood that various changes and modifications may be made therein without departing from the scope of the appended claims.

What is claimed is:

1. A method of measuring strain of an object with a bridge having in an arm thereof a strain gage applied to the object for producing a resistance change depending on the strain developed in the object, and resistors in respective remaining three arms thereof, said resistors having respective resistances independent of the strain developed in the object, said bridge having a pair of power corners respectively at a pair of diagonally opposite joints thereof and a pair of signal corners respectively at a pair of other diagonally opposite joints thereof, said method comprising the steps of:

detecting an output voltage between said signal corners as an initial unbalanced output voltage $e_0$ of said bridge while no strain is being detected by said strain gage;

applying a power supply voltage between said power corners of the bridge and detecting an output voltage e between said signal corners to detect strain of the object; and measuring strain developed in said object based on a value $\epsilon_a$ determined using the detected output voltage e and said initial unbalanced output voltage $e_0$ according to the following equation (1):

$$\varepsilon_a = \frac{V}{K} \cdot \frac{e - e_0}{\left(\frac{R_3}{R_3 + R_4} \cdot V - e\right) \cdot \left(\frac{R_4}{R_3 + R_4} \cdot V + e_0\right)} \tag{1}$$

where V represents the power supply voltage applied between said power corners of said bridge, K the gage factor of said strain gage, $R_3$ the resistance of the resistor in the arm of said bridge which is opposite to said arm with said strain gage; and $R_4$ the resistance of the resistor in the arm of said bridge which is positioned adjacent to said arm with said strain gage across one of said power corners.

2. A method according to claim 1, wherein said bridge comprises a bridge based on either one of a one-gate two-wire method, a one-gage three-wire method, and a two-gage common-dummy method.

3. A method according to claim 1, wherein said resistance $R_3$ of the resistor in the arm of said bridge which is opposite to said arm with said strain gage and said resistance $R_4$ of the resistor in the arm of said bridge which is positioned adjacent to said arm with said strain gage across one of said power corners are substantially the same as each other.

4. A method according to claim 3, wherein said power supply voltage V applied between said power corners of said bridge is substantially 2 (V), and the gage factor K of said strain gage is substantially 2.

5. A method according to claim 1, further comprising the steps of:

while said power supply voltage V is being applied between said power corners of said bridge, detecting at least one of a voltage $V_3$ produced across the arm of said bridge which is opposite to said arm with said strain gage and a voltage $V_4$ produced across the arm of said bridge which is positioned adjacent to said arm with said strain gage across one of said power corners; and calculating said equation (1) using the detected voltage $V_3$ or $V_4$ according to one of the following equations (2), (3), and (4):

$$\varepsilon_a = \frac{V}{K} \cdot \frac{e - e_0}{(V_3 - e) \cdot [(V - V_3) + e_0]} \tag{2}$$

$$\varepsilon_a = \frac{V}{K} \cdot \frac{e - e_0}{[(V - V_4) - e] \cdot (V_4 + e_0)} \tag{3}$$

-continued $$\varepsilon_a = \frac{V}{K} \cdot \frac{e - e_0}{(V_3 - e) \cdot (V_4 + e_0)}. \quad (4)$$

6. A method according to claim 1, wherein each of the resistances of said resistors in the respective remaining three arms of said bridge, other than the arm with said strain gage, is substantially the same as the reference resistance of said strain gage when no strain is being detected by said strain gage, further comprising the steps of:

calculating the following equation (5) using the output voltage e produced between said signal corners when strain is measured and said initial unbalanced output voltage $e_0$;

$$\varepsilon_p = \frac{4}{K} \cdot \frac{e}{V - 2e} - \frac{4}{K} \cdot \frac{e_0}{V - 2e_0} \quad (5)$$

$$= \frac{4V}{K} \cdot \frac{e - e_0}{(V - 2e) \cdot (V - 2e_0)}$$

calculating the following equation (6) using said initial unbalanced output voltage $e_0$; and $$\varepsilon_0 = \frac{4}{k} \cdot \frac{e_0}{V - 2e_0} \quad (6)$$

calculating said equation (1) using a value $\varepsilon_p$ determined by the equation (5) and a value $\varepsilon_0$ determined by the equation (6), according to the following equation (7):

$$\varepsilon_a = \frac{1}{1 + K \cdot \varepsilon_0} \cdot \varepsilon_p. \quad (7)$$

7. A method according to claim 1, wherein said strain gage is connected to said resistors by a pair of leads connected to respective terminals of the strain gage, at least one of said leads being placed in the same arm as said strain gage, further comprising the step of:

measuring the strain developed in said object based on a value $\epsilon_b$ which is produced by multiplying the determined value $\epsilon_a$ by a ratio $(R_0+r)/R_0$ of the sum $(R_0+r)$ of the reference resistance $R_0$ of said strain gage when no strain is being detected by said strain gage and the total resistance r of said lead placed in the same arm as said strain gage to said reference resistance $R_0$.

8. A method according to claim 2, wherein said strain gage is connected to said resistors by a pair of leads connected to respective terminals of the strain gage, at least one of said leads being placed in the same arm as said strain gage, further comprising the step of:

measuring the strain developed in said object based on a value $\epsilon_b$ which is produced by multiplying the determined value $\epsilon_a$ by a ratio $(R_0+r)/R_0$ of the sum $(R_0+r)$ of the reference resistance $R_0$ of said strain gage when no strain is being detected by said strain gage and the total resistance r of said lead placed in the same arm as said strain gage to said reference resistance $R_0$.

9. A method according to claim 3, wherein said strain gage is connected to said resistors by a pair of leads connected to respective terminals of the strain gage, at least one of said leads being placed in the same arm as said strain gage, further comprising the step of:

measuring the strain developed in said object based on a value $\epsilon_b$ which is produced by multiplying the determined value $\epsilon_a$ by a ratio $(R_0+r)/R_0$ of the sum $(R_0+r)$ of the reference resistance $R_0$ of said strain gage when no strain is being detected by said strain gage and the total resistance r of said lead placed in the same arm as said strain gage to said reference resistance $R_0$.

10. A method according to claim 4, wherein said strain gage is connected to said resistors by a pair of leads connected to respective terminals of the strain gage, at least one of said leads being placed in the same arm as said strain gage, further comprising the step of:

measuring the strain developed in said object based on a value $\epsilon_b$ which is produced by multiplying the determined value $\epsilon_a$ by a ratio $(R_0+r)/R_0$ of the sum $(R_0+r)$ of the reference resistance $R_0$ of said strain gage when no strain is being detected by said strain gage and the total resistance r of said lead placed in the same arm as said strain gage to said reference resistance $R_0$.

11. A method according to claim 5, wherein said strain gage is connected to said resistors by a pair of leads connected to respective terminals of the strain gage, at least one of said leads being placed in the same arm as said strain gage, further comprising the step of:

measuring the strain developed in said object based on a value $\epsilon_b$ which is produced by multiplying the determined value $\epsilon_a$ by a ratio $(R_0+r)/R_0$ of the sum $(R_0+r)$ of the reference resistance $R_0$ of said strain gage when no strain is being detected by said strain gage and the total resistance r of said lead placed in the same arm as said strain gage to said reference resistance $R_0$.

12. A method according to claim 6, wherein said strain gage is connected to said resistors by a pair of leads connected to respective terminals of the strain gage, at least one of said leads being placed in the same arm as said strain gage, further comprising the step of:

measuring the strain developed in said object based on a value $\epsilon_b$ which is produced by multiplying the determined value $\epsilon_a$ by a ratio $(R_0+r)/R_0$ of the sum $(R_0+r)$ of the reference resistance $R_0$ of said strain gage when no strain is being detected by said strain gage and the total resistance r of said lead placed in the same arm as said strain gage to said reference resistance $R_0$.

* * * * *